(12) United States Patent
Pan et al.

(10) Patent No.: US 12,278,176 B2
(45) Date of Patent: Apr. 15, 2025

(54) INTEGRATED CIRCUIT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Yi-Wen Pan, New Taipei (TW); Chung-Chi Ko, Nantou County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 652 days.

(21) Appl. No.: 17/492,423

(22) Filed: Oct. 1, 2021

(65) Prior Publication Data

US 2022/0359376 A1    Nov. 10, 2022

Related U.S. Application Data

(60) Provisional application No. 63/185,084, filed on May 6, 2021.

(51) Int. Cl.
| | |
|---|---|
| *H01L 23/522* | (2006.01) |
| *H01L 21/768* | (2006.01) |
| *H01L 23/528* | (2006.01) |
| *H01L 29/417* | (2006.01) |
| *H01L 29/423* | (2006.01) |

(52) U.S. Cl.
CPC .... *H01L 23/5226* (2013.01); *H01L 21/76819* (2013.01); *H01L 21/76829* (2013.01); *H01L 21/76831* (2013.01); *H01L 23/5283* (2013.01); *H01L 29/41725* (2013.01); *H01L 29/4232* (2013.01)

(58) Field of Classification Search
CPC ............ H01L 23/5329; H01L 23/5226; H01L 23/53238; H01L 21/76897; H01L 21/76816; H01L 21/76819; H01L 21/76829; H01L 21/76831
See application file for complete search history.

(56) References Cited

U.S. PATENT DOCUMENTS

| | | | |
|---|---|---|---|
| 6,331,481 B1* | 12/2001 | Stamper ............ | H01L 21/76885 438/626 |
| 10,224,242 B1* | 3/2019 | Yang ................... | H01L 23/5283 |
| 2009/0263951 A1* | 10/2009 | Shibata ............... | H01L 23/5222 257/E21.573 |
| 2009/0286384 A1* | 11/2009 | Wu .................... | H01L 21/76883 438/692 |

(Continued)

*Primary Examiner* — Zandra V Smith
*Assistant Examiner* — John M Parker
(74) *Attorney, Agent, or Firm* — Maschoff Brennan

(57) ABSTRACT

An integrated circuit structure includes a substrate, a transistor, a first dielectric layer, a metal contact, a first low-k dielectric layer, a second dielectric layer, and a first metal feature. The transistor is over the substrate. The first dielectric layer is over the transistor. The metal contact is in the first dielectric layer and electrically connected to the transistor. The first low-k dielectric layer is over the first dielectric layer. The second dielectric layer is over the first low-k dielectric layer and has a dielectric constant higher than a dielectric constant of the first low-k dielectric layer. The first metal feature extends through both second dielectric layer and the first low-k dielectric layer to the metal contact.

20 Claims, 31 Drawing Sheets

(56) References Cited

U.S. PATENT DOCUMENTS

| | | | |
|---|---|---|---|
| 2010/0093168 A1* | 4/2010 | Naik | H01L 21/76834 438/618 |
| 2013/0069233 A1* | 3/2013 | Chou | H01L 21/76885 257/E23.141 |
| 2013/0328198 A1* | 12/2013 | Chou | H01L 21/76885 257/751 |
| 2014/0131872 A1* | 5/2014 | Lu | H01L 23/53295 257/751 |
| 2014/0197538 A1* | 7/2014 | Lu | H01L 21/76892 257/751 |
| 2015/0137378 A1* | 5/2015 | Wu | H01L 21/7682 257/773 |
| 2015/0187699 A1* | 7/2015 | Baek | H01L 23/5222 257/773 |
| 2018/0025974 A1* | 1/2018 | Basker | H01L 21/7682 257/534 |
| 2019/0027406 A1* | 1/2019 | Chu | H01L 21/76885 |
| 2019/0267279 A1* | 8/2019 | Cheng | H01L 23/5222 |
| 2021/0343588 A1* | 11/2021 | Lin | H01L 21/76802 |

* cited by examiner

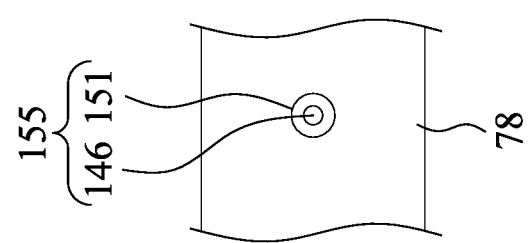

INTEGRATED CIRCUIT STRUCTURE AND METHOD FOR FORMING THE SAME

PRIORITY CLAIM AND CROSS-REFERENCE

The present application claims priority to U.S. Provisional Application Ser. No. 63/185,084, filed May 6, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
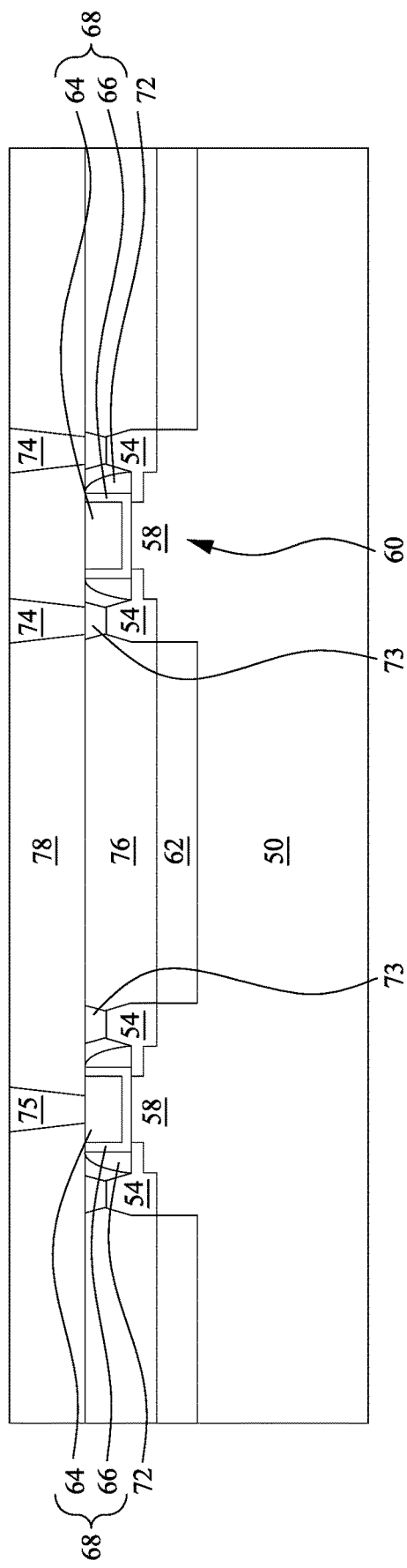
FIGS. 1 to 22 show various stages of a sequential manufacturing operation of an integrated circuit structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a semiconductor substrate 50 in which various electronic devices may be formed, in accordance with some embodiments. Generally, the substrate 50 illustrated in FIG. 1 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

A fin-type field effect transistor (FinFET) device 60 is disposed on the substrate 50. In some embodiments, the FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may include any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow, a sacrificial dummy gate structure (not shown) is formed after forming the STI regions 62. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over a the portion of fin 58 protruding above the STI 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may include heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may include an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof.

A first interlayer dielectric (ILD) 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76. The HKMG gate structures 68, illustrated in FIG. 1, may then be formed by first removing the dummy gate structures using one or more etching techniques, thereby creating trenches between respective spacers 72. Next, a replacement gate dielectric layer 66 comprising one more dielectrics, followed by a replacement conductive gate layer 64 comprising one or more conductive materials, are deposited to completely fill the recesses. Excess portions of the gate structure layers 64 and 66 may be removed from over the top surface of first ILD layer 76 using, for example a CMP process. The resulting structure, as illustrated in FIG. 1, may be a substantially coplanar surface comprising an exposed top surface of first ILD layer 76, spacers 72, and remaining portions of the HKMG gate layers 66 and 64 inlaid between respective spacers 72.

Source/drain contacts 73 are formed in the first ILD layer 76 and make electrical connections to the source and drain regions 54 of FinFETs 60. The source/drain contacts 73 may be formed using photolithography techniques. For example, a patterned mask may be formed over the first ILD layer 76 and used to etch openings that extend through the first ILD layer 76 and the CESL (not shown) below first ILD layer 76 to expose portions of the source and drain regions 54. In some embodiments, an anisotropic dry etch process may be used.

In some embodiments, a conductive liner may be formed in the openings in the first ILD layer 76. Subsequently, the openings are filled with a conductive fill material. The liner includes metals used to reduce out-diffusion of conductive materials from the source/drain contacts 73 into the surrounding dielectric materials. In some embodiments, the liner may include two metal layers. The first metal layer comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first metal layer may include Ti, Ni, Pt, Co, other suitable metals, or their alloys. The second metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the first ILD layer 76. The resulting conductive plugs extend into the first ILD layer 76 and constitute the source/drain contacts 73 making physical and electrical connections to the electrodes of electronic devices, such as the FinFET 60 illustrated in FIG. 1.

A second ILD layer 78 may be deposited over the first ILD layer 76, as illustrated in FIG. 1. In some embodiments, the insulating materials to form the first ILD layer 76 and the second ILD layer 78 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on coating, and/or the like, or a combination thereof.

The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Figure 22:
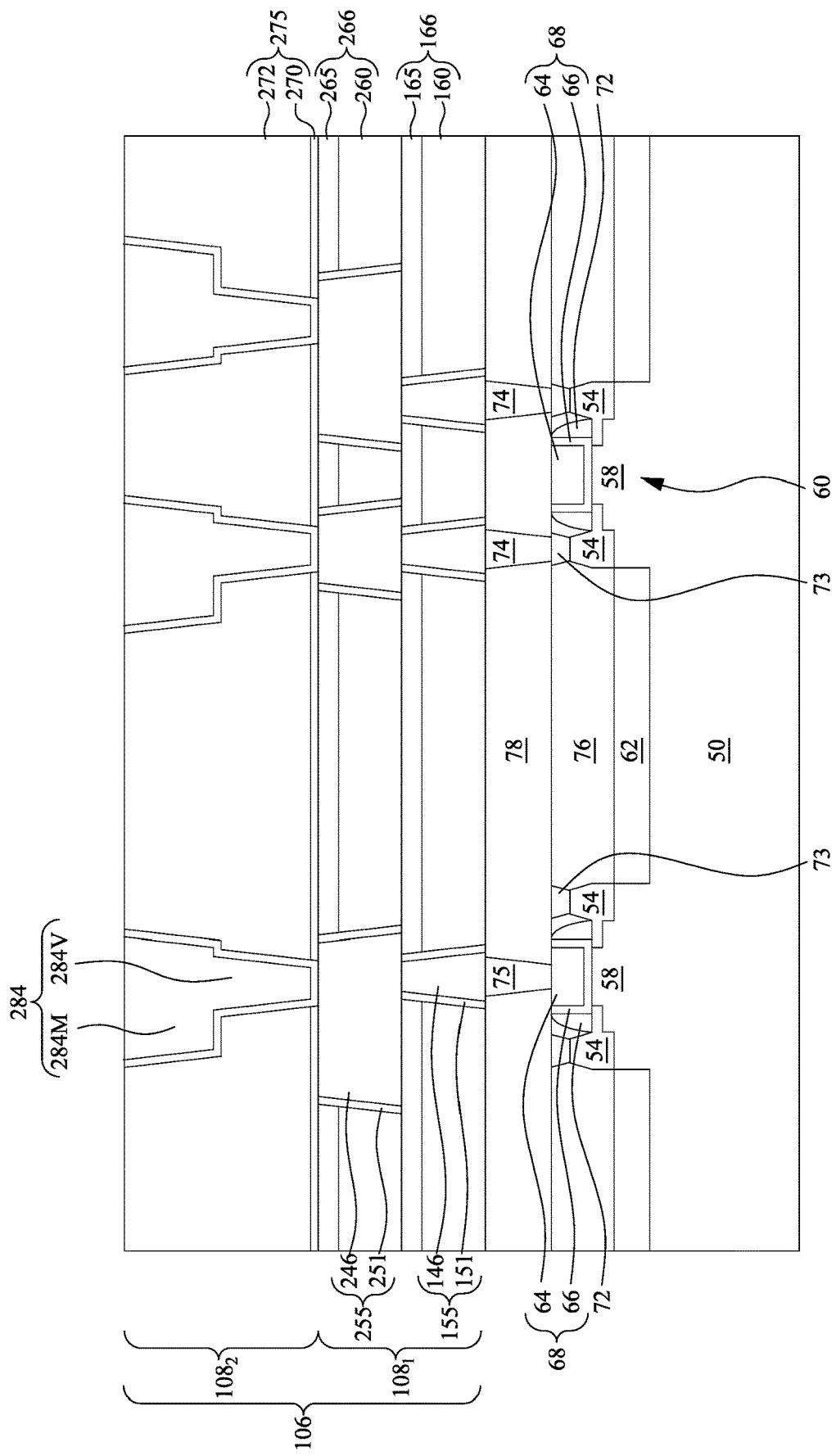

As illustrated in FIG. 1, source/drain vias 74 are formed in the second ILD layer 78 and making electrical connections to corresponding source/drain contacts 73. Gate contacts 75 are formed in the second ILD layer 78 and making electrical connection to corresponding gate electrodes 64 of FinFETs 60, respectively. The gate contacts 75, the source/drain contacts 73, and the source/drain vias 74 can be referred to as middle-end-of-line (MEOL) conductive features that electrically connect front-end-of-line (FEOL) conductive features (for example, gate structures 68 and/or source/drain regions 54) to back-end-of-line (BEOL) conductive features (for example, metal vias and metal lines in the interconnect structure 106 as illustrated in FIG. 22). The gate contacts 75 and the source/drain vias 74 may be formed using photolithography techniques. For example, a patterned mask may be formed over the second ILD layer 78 and used to etch openings that extend through the second ILD layer 78 to expose a portion of gate electrodes over STI regions 62 and the source/drain contacts 73. In some embodiments, an anisotropic dry etch process may be used to etch the openings.

In some embodiments, a conductive liner may be formed in the openings in the second ILD layer 78. Subsequently, the openings are filled with a conductive fill material. The liner includes metals used to reduce out-diffusion of conductive materials from the gate contacts 75 and the source/drain vias 74 into the surrounding dielectric materials. In some embodiments, the liner may include two metal layers. The first metal layer may include Ti, Ni, Pt, Co, other suitable metals, or their alloys. The second metal layer of the conductive liner may additionally include other metals (e.g., TiN, TaN, Ta, or other suitable metals, or their alloys). A conductive fill material may be deposited over the conductive liner layer to fill the contact openings, using any acceptable deposition technique (e.g., CVD, ALD, PEALD, PECVD, PVD, ECP, electroless plating, or the like, or any combination thereof). The conductive fill material may be tungsten (W) or other suitable conductive materials, such as Al, Cu, Ru, Ni, Co, alloys of these, combinations thereof, and the like. Next, a planarization process (e.g., CMP) may be used to remove excess portions of all the conductive materials from over the surface of the second ILD layer 78. The resulting conductive plugs extend into the second ILD layer 78 and constitute gate contacts 75 and the source/drain vias 74 making physical and electrical connections to the gate electrodes 64 and the source/drain contacts 73, respectively.

In some embodiments, each of the source/drain contacts 73, the source/drain vias 74, and the gate contacts 75 may include an inverted trapezoid cross-sectional profile. That is, widths of the source/drain contacts 73, the source/drain vias 74, and the gate contacts 75 may increase as a distance from the substrate 50 increases.

Figure 2:
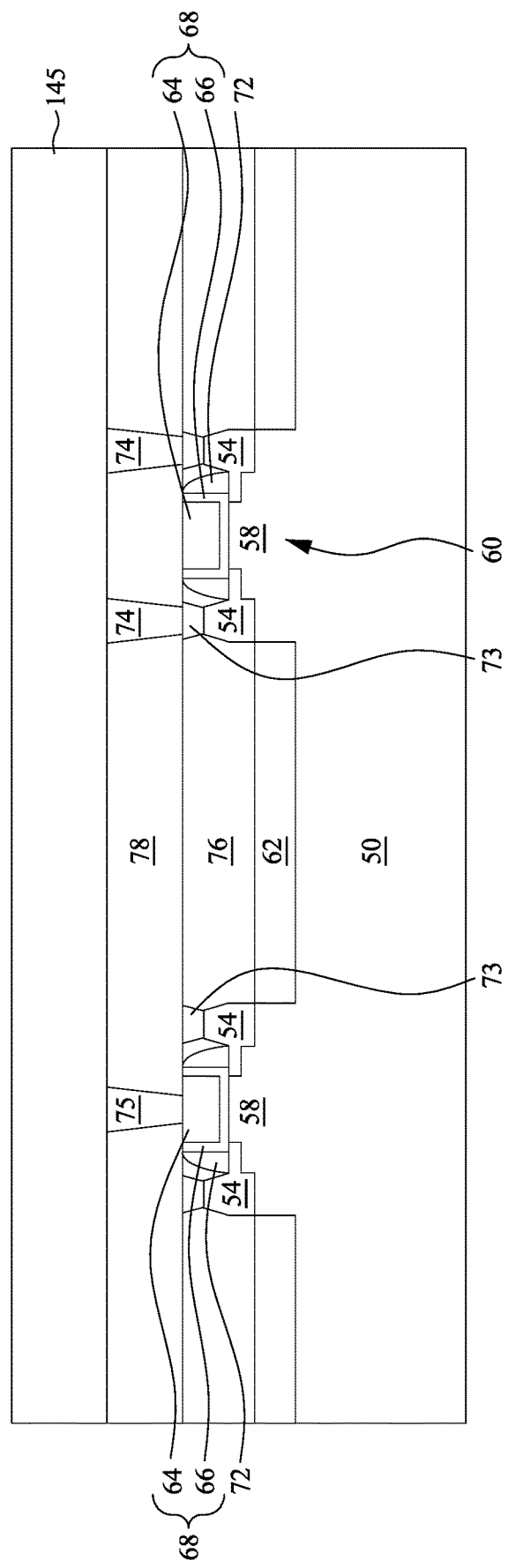

Reference is made to FIG. 2. A metal layer 145 is formed over the ILD layer 78. In some embodiments, material of the metal layer 145 can include copper or copper alloys, or other suitable conductive materials, such as silver, gold, tungsten, aluminum, or other suitable materials. In some embodiments, the metal layer 145 may be formed by, for example, CVD, ALD, PVD, or the like.

Figure 3:
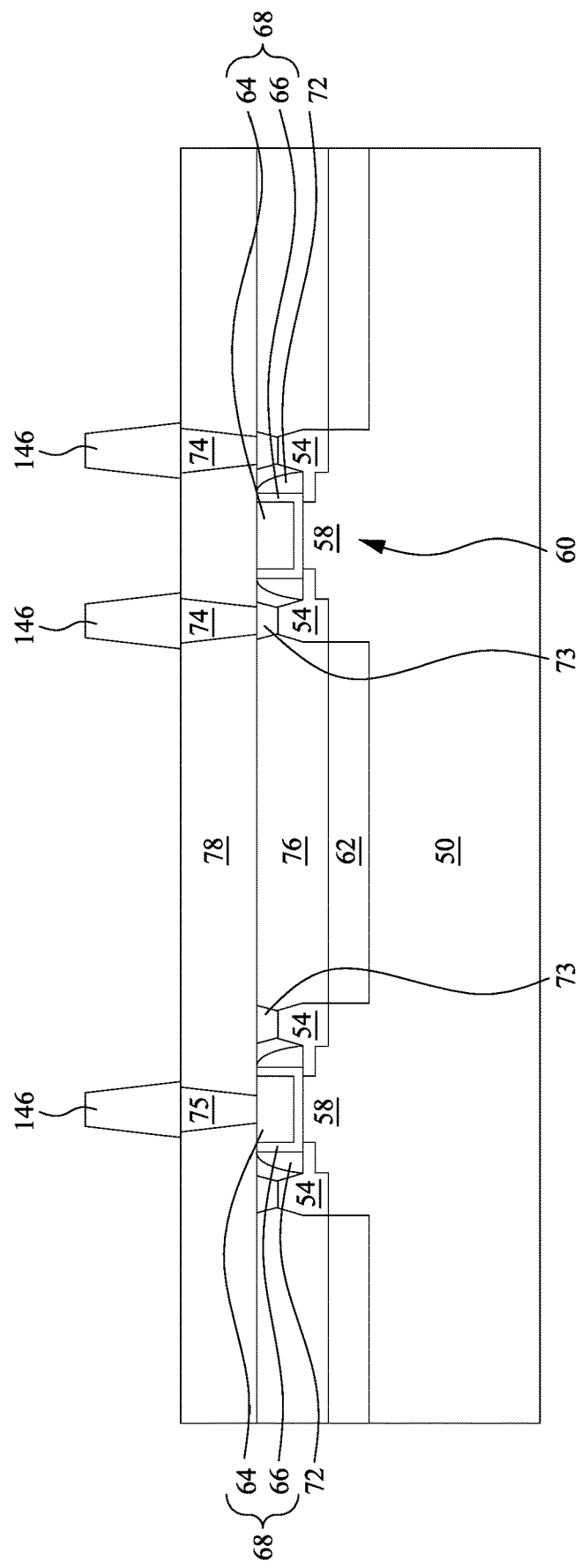

Reference is made to FIG. 3. The metal layer 145 is patterned to form a plurality of via plugs 146. In some embodiments, the metal layer 145 may be patterned by, for example, forming a mask layer (e.g., a photoresist) over the metal layer 145, patterning the mask layer to expose portions of the metal layer 145, and etching the expose portions of the metal layer 145. The remaining portions of the metal layer 145 are referred to as via plugs 146. In some embodiments, the via plugs 146 may be in contact with the gate contacts 75 and the source/drain vias 74, respectively. In some embodiments, a bottom surface of each via plug 146 may be wider than a top surface of each gate contact 75 and/or a top surface of each source/drain via 74, which in turn will reduce the resistance between via plug 146 and corresponding gate contact 75 or source/drain via 74. In some other embodiments, a bottom surface of each via plug 146 may be equal to or narrower than a top surface of each gate contact 75 and/or a top surface of each source/drain via 74.

In some embodiments, the via plug 146 may include a trapezoid cross-sectional profile. That is, a width of the via plug 146 may decrease as a distance from the substrate 50 increases. Stated another way, a top surface of the via plug 146 is narrower than a bottom surface of the via plug 146. In some embodiments, each of the via plugs 146 has a bottom surface in contact with a top surface of the ILD layer 78.

Figure 4:
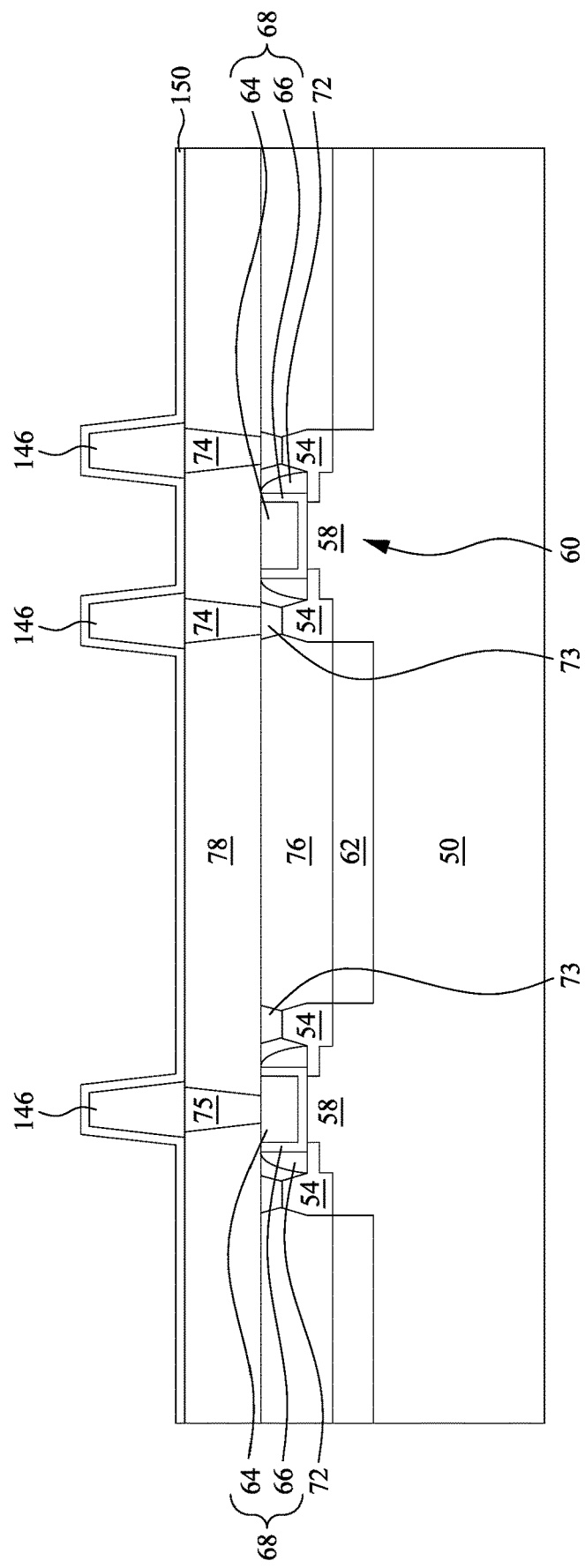

Reference is made to FIG. 4. A diffusion barrier layer 150 is formed over the substrate 50 and covering the via plugs 146 and the ILD layer 78. In some embodiments, the diffusion barrier layer 150 may be deposited in a conformal manner, such that the diffusion barrier layer 150 may extend along exposed surfaces of the via plugs 146 and the ILD layer 78. In some embodiments, the diffusion barrier layer 150 may include barrier materials such as titanium (Ti), titanium nitride (TiN), tantalum (Ta), tantalum nitride (TaN), and combinations thereof, and can be formed using CVD, ALD, PVD, or the like.

Figure 5A:
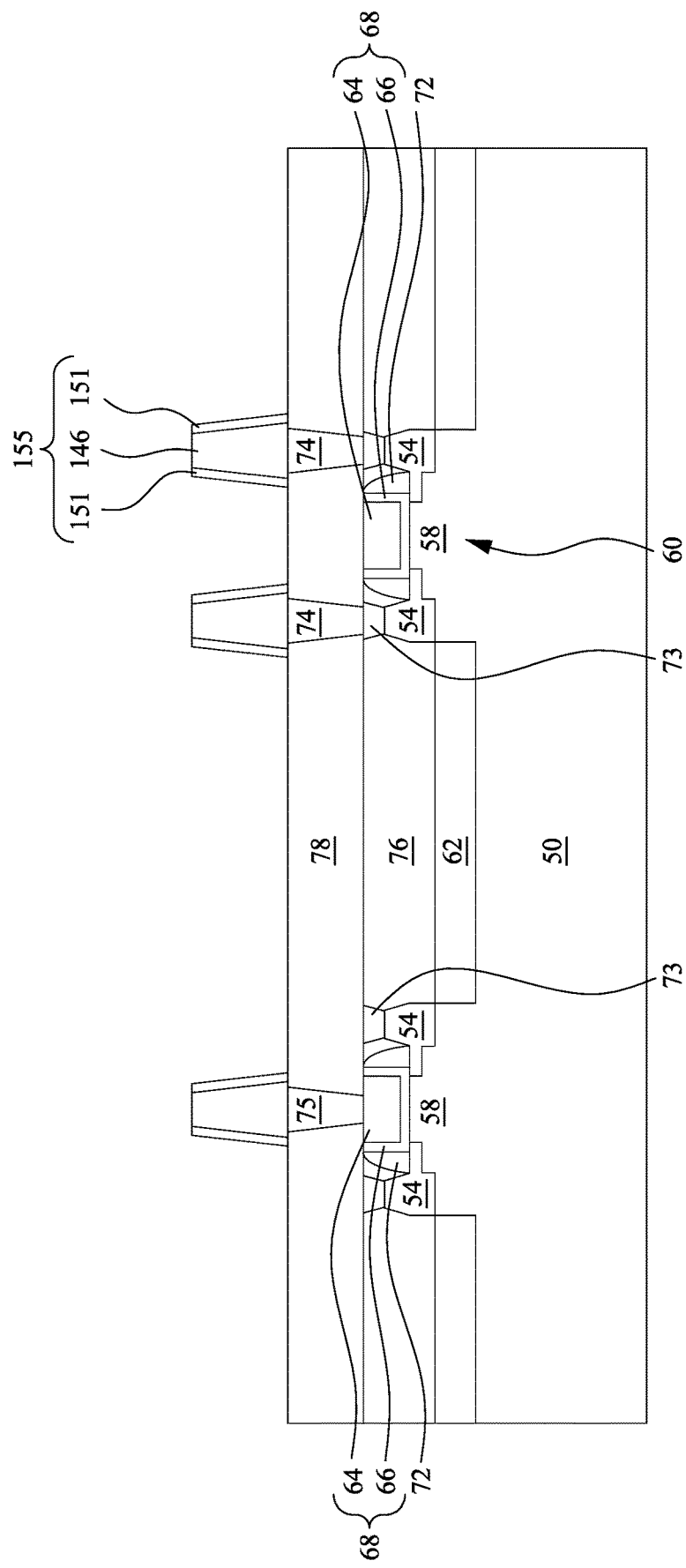

Reference is made to FIG. 5A. The diffusion barrier layer 150 is patterned to form diffusion barriers 151 on opposite sidewalls of each of the via plugs 146. In some embodiments, the diffusion barrier layer 150 may be patterned by, for example, an anisotropic etching process may be performed to remove horizontal portions of the diffusion barrier layer 150 on the top surfaces of the main portions 146M of the via plugs 146 and on the top surface of the etch stop layer 140. After the etching process, the remaining portions of the diffusion barrier layer 150 can be referred to as the diffusion barriers 151. As shown in FIG. 5B, in some embodiments where the via plugs 146 are round pillars having circular top-view profiles, the diffusion barriers 151 form ring-shaped structures around the respective via plugs 146.

After the diffusion barriers 151 are formed, the diffusion barriers 151 and a corresponding via plug 146 may be collectively referred to as a metal via 155. In some embodiments, each of the metal via 155 includes via plug 146 and the diffusion barriers 151 lining opposite sidewalls of the via plug 146. In some embodiments, the bottom surfaces of the diffusion barriers 151 are in contact with the ILD layer 78, and is substantially level with the bottom surface of the via plug 146.

Figure 6:
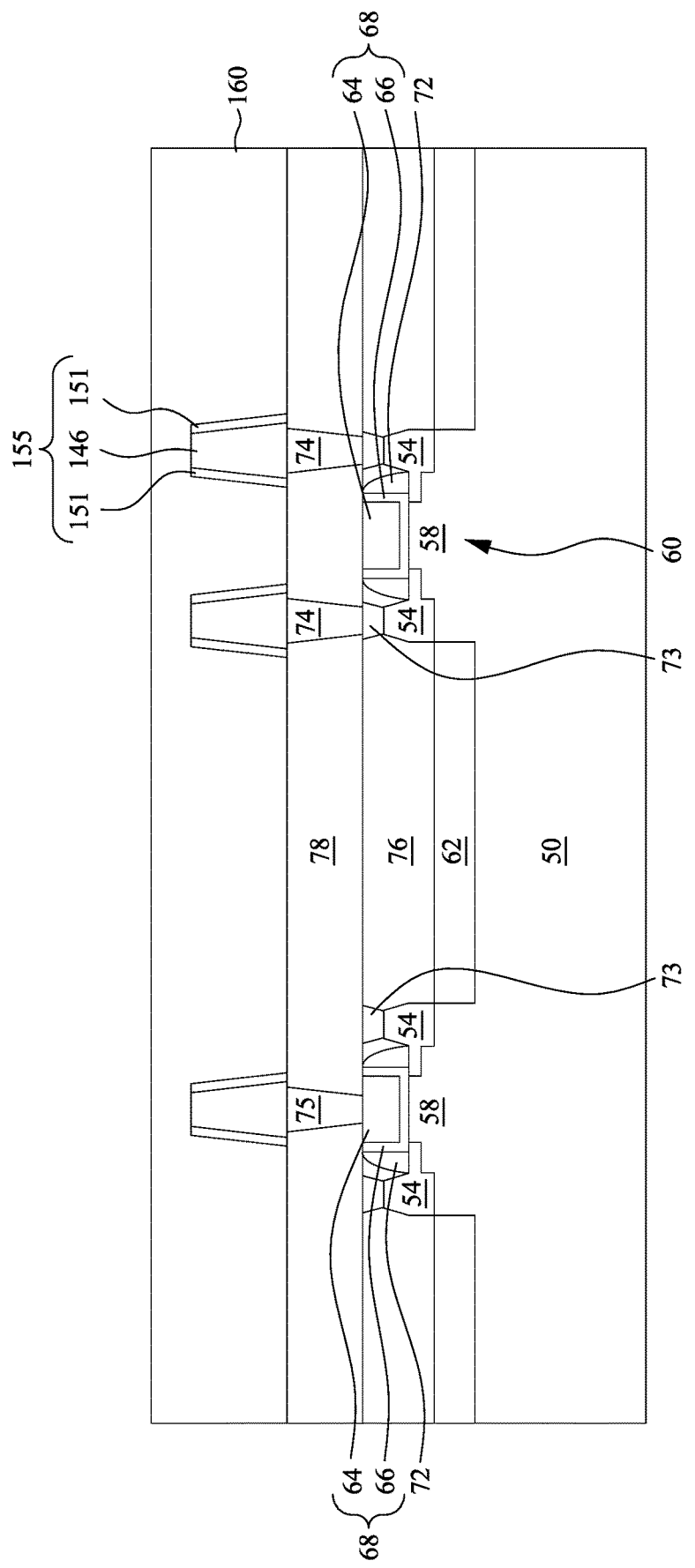

Reference is made to FIG. 6. A dielectric layer 160 is formed over the metal vias 155 and filling the spaces between the metal vias 155. In some embodiments, the dielectric layer 160 is in contact with the top surface of the ILD layer 78, and is in contact with the sidewalls and the top surface of the metal vias 155. In greater details, the dielectric layer 160 is in contact with outer sidewalls and top surfaces of the diffusion barriers 151, and is in contact with the top surfaces of the via plug 146.

In some embodiments, the dielectric layer 160 may be formed of a low-k dielectric material, such as hydrogen doped silicon oxycarbide (SiOC:H). Accordingly, the dielectric layer 160 can also be referred to as a low-k dielectric layer. In some embodiments, the dielectric constant of the dielectric layer 160 is in a range from about 200 A to about 1000 A. In some embodiments where the dielectric layer 160 is made of hydrogen doped silicon oxycarbide (SiOC:H), the dielectric constant of the dielectric layer 160 is about $2.6 \leq k \leq 3.3$. The dielectric layer 160 can be deposited with a high-density plasma CVD (HDPCVD), a PECVD process, ALD process, a plasma enhanced ALD (PEALD) process, or other suitable deposition processes.

Figure 7:
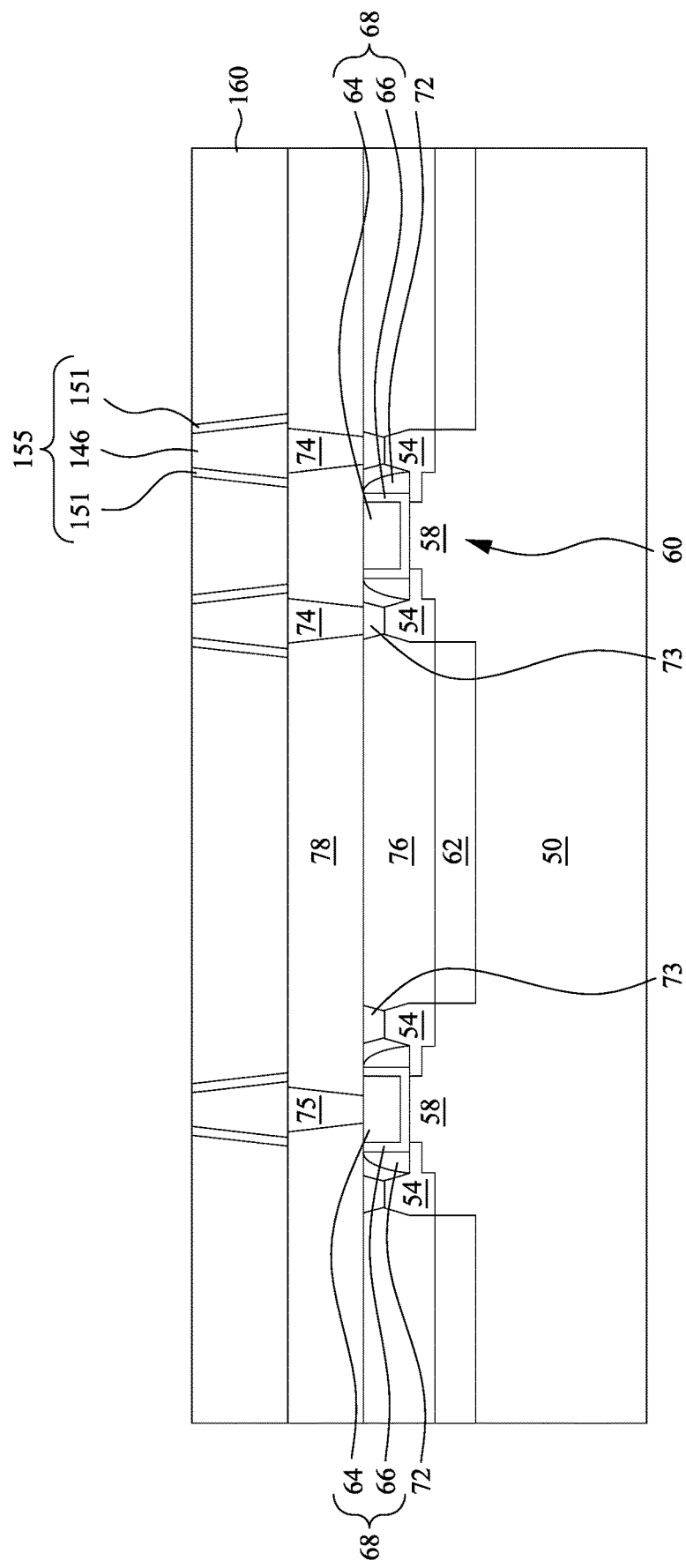

Reference is made to FIG. 7. A CMP process is performed to remove excess material of the dielectric layer 160 until the metal vias 155 are exposed. In some embodiments, after the CMP process, the top surface of the dielectric layer 160 is substantially level with the top surfaces of the metal vias 155. In greater details, the CMP process is performed to lower the top surface of the dielectric layer 160 from a position higher than the top surfaces of the metal vias 155 to a position that is level with the top surfaces of the metal vias 155. In some embodiments, the CMP process is omitted.

Figure 8:
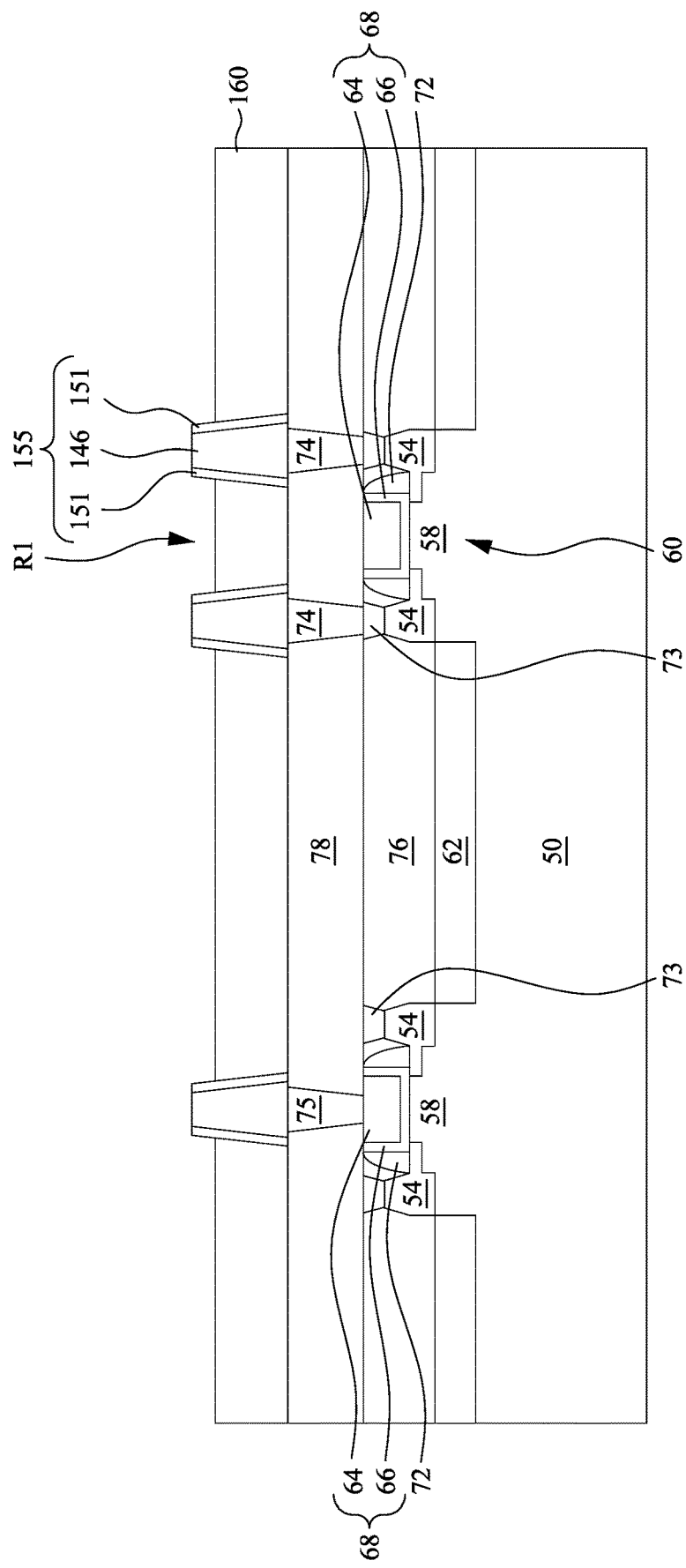

Reference is made to FIG. 8. The dielectric layer 160 is etched back to form recesses R1 between the metal vias 155. Accordingly, sidewalls of the upper portions of the metal vias 155 are exposed. In greater details, the sidewalls of the upper portions of the diffusion barriers 151 are exposed.

In some embodiments, the top surface of the dielectric layer 160 is lowered from a position that is level with the top surfaces of the metal vias 155 to a position lower than the top surfaces of the metal vias 155. In some embodiments where the CMP process of FIG. 7 is omitted, the etching back process may be performed to the structure shown in FIG. 6. In that case, the etching back process pulls back the top surface of the dielectric layer 160 from a position higher than the top surfaces of the metal vias 155 to a position lower than the top surfaces of the metal vias 155.

Figure 9:
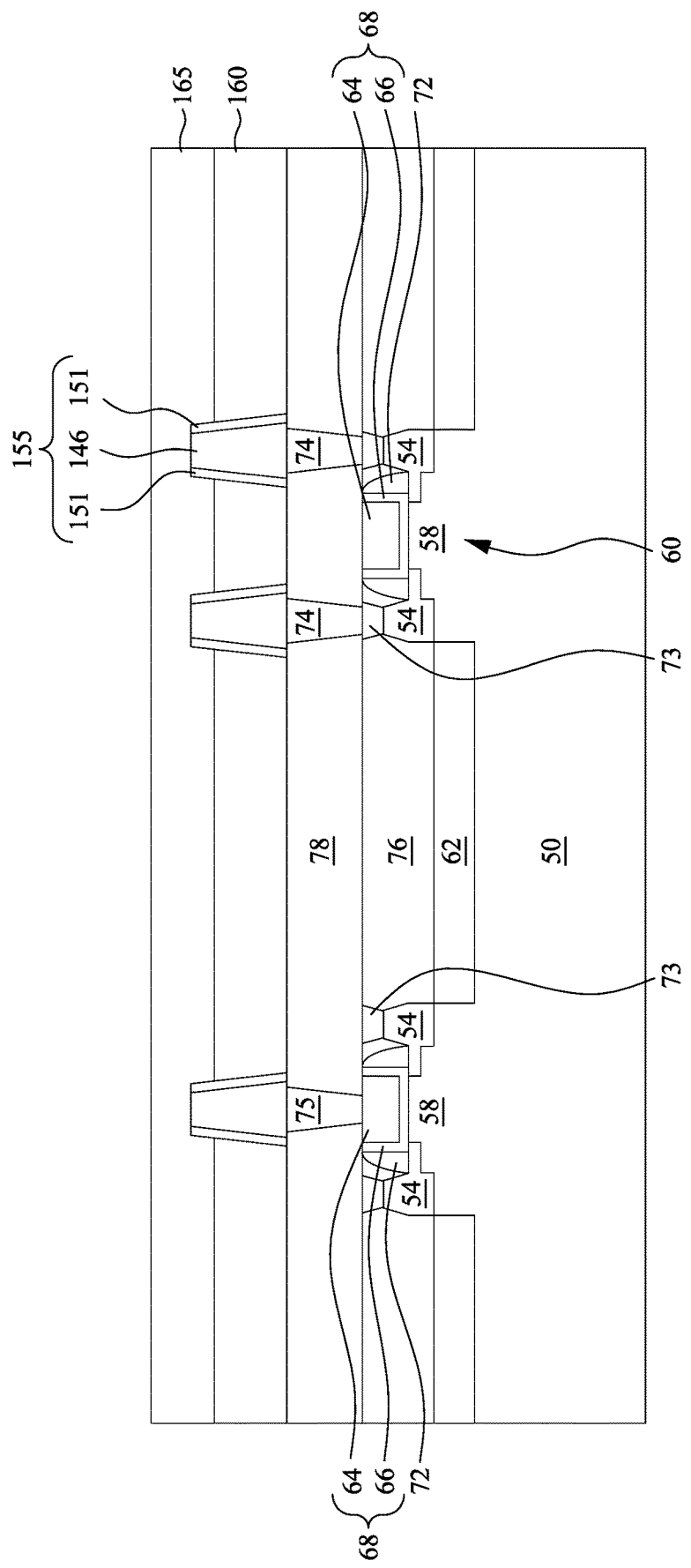

Reference is made to FIG. 9. A dielectric layer 165 is formed over the metal vias 155 and filling the recesses R1 between the metal vias 155. In some embodiments, the dielectric layer 165 is in contact with the top surface of the dielectric layer 160, and is in contact with the sidewalls and the top surface of the metal vias 155. In greater details, the dielectric layer 160 is in contact with upper portions of the sidewalls of the metal vias 155 and top surfaces of the metal vias 155.

In some embodiments, the dielectric layer 165 may include a dielectric material that has a higher dielectric constant than the dielectric layer 160. In some embodiments where the dielectric layer 165 is made of silicon oxide, the dielectric constant of the dielectric layer 165 is about 3.9. In some embodiments, the atomic percentage of carbon of the dielectric layer 160 may be higher than that of the dielectric layer 165. On the other hand, the atomic percentage of oxygen of the dielectric layer 160 may be lower than that of the dielectric layer 165. In some embodiments, the dielectric layer 165 may include silicon oxide. The dielectric layer 165 can be deposited with a high-density plasma CVD (HDPCVD), a PECVD, a flowable CVD process, or other suitable deposition processes.

Figure 10:
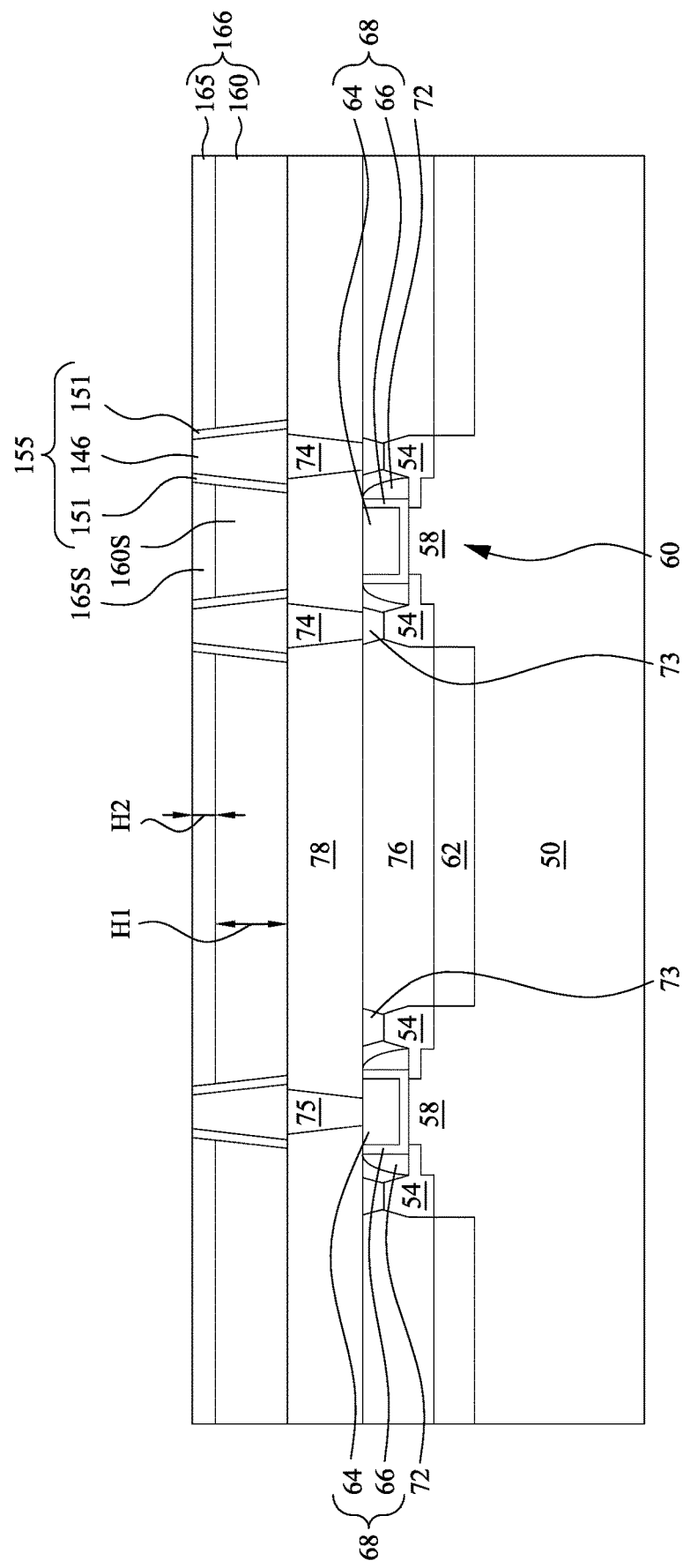

Reference is made to FIG. 10. A CMP process is performed to remove excess material of the dielectric layer 165 until the metal vias 155 are exposed. In some embodiments, after the CMP process, the top surface of the dielectric layer 165 is substantially level with the top surfaces of the metal vias 155. In greater details, the CMP process is performed to lower the top surface of the dielectric layer 165 from a position higher than the top surfaces of the metal vias 155 to a position that is level with the top surfaces of the metal vias 155. In some embodiments, the dielectric layers 160 and 165 may be collectively referred to as an inter-metal dielectric (IMD) layer 166.

After the CMP process is complete, the dielectric layer 160 has a height H1 and the dielectric layer 165 has a height H2. In some embodiments, the height H1 of the dielectric layer 160 is greater than the height H2 of dielectric layer 165. Stated another way, the dielectric layer 160 is thicker than the dielectric layer 165 along the vertical direction.

The dielectric layer 165 can act as a protective layer for the dielectric layer 160. In some embodiments, if the dielectric layer 160 is exposed to an etching process (e.g., a dry etch or a wet etch) or a metal treatment process to the metal vias 155, surfaces of the dielectric layer 160 may be easily damaged. By forming a dielectric layer 165 over the dielectric layer 160, the dielectric layer 160 may be protected from subsequent processes, and thus the device reliability may be improved. For example, the time dependent dielectric breakdown (TDDB) and dielectric voltage breakdown (VBD) performance of the device may be improved.

In some embodiments, the height H2 of dielectric layer 165 is in a range from about 100 Å to about 300 Å. If the height H2 of dielectric layer 165 is too large (e.g., much greater than 300 Å), the height H1 of the dielectric layer 160 may be accordingly reduced, and the overall dielectric constant may be too high. If the height H2 of dielectric layer 165 is too small (e.g., much lower than 100 Å), the dielectric layer 165 may be insufficient to protect the underlying dielectric layer 160.

In some embodiments, after the CMP process is complete, the dielectric layer 160 may include inter-via dielectric portions 160S each between two adjacent metal vias 155, and the dielectric layer 165 may include inter-via dielectric portions 165S each between two adjacent metal vias 155, in which the inter-via dielectric portion 165S of the dielectric layer 165 is over the inter-via dielectric portion 160S of the dielectric layer 160. In some embodiments, the inter-via dielectric portion 160S of the dielectric layer 160 and the inter-via dielectric portion 165S of the dielectric layer 165 may include an inverted trapezoid cross-sectional profile. That is, a width of the inter-via dielectric portion 160S of the dielectric layer 160 and a width of the inter-via dielectric portion 165S of the dielectric layer 165 may increase as distance from the substrate 50 increase. Stated another way, the top surface of the inter-via dielectric portion 160S of the dielectric layer 160 is wider than the bottom surface of the inter-via dielectric portion 160S of the dielectric layer 160, and the top surface of the inter-via dielectric portion 165S of the dielectric layer 165 is wider than the bottom surface of the inter-via dielectric portion 165S of the dielectric layer 165. In some embodiments, the top surface of the inter-via dielectric portion 165S of the dielectric layer 165 is wider than the top surface of the inter-via dielectric portion 160S of the dielectric layer 160, and the bottom surface of the inter-via dielectric portion 165S of the dielectric layer 165 is wider than the bottom surface of the inter-via dielectric portion 160S of the dielectric layer 160.

Figure 11:
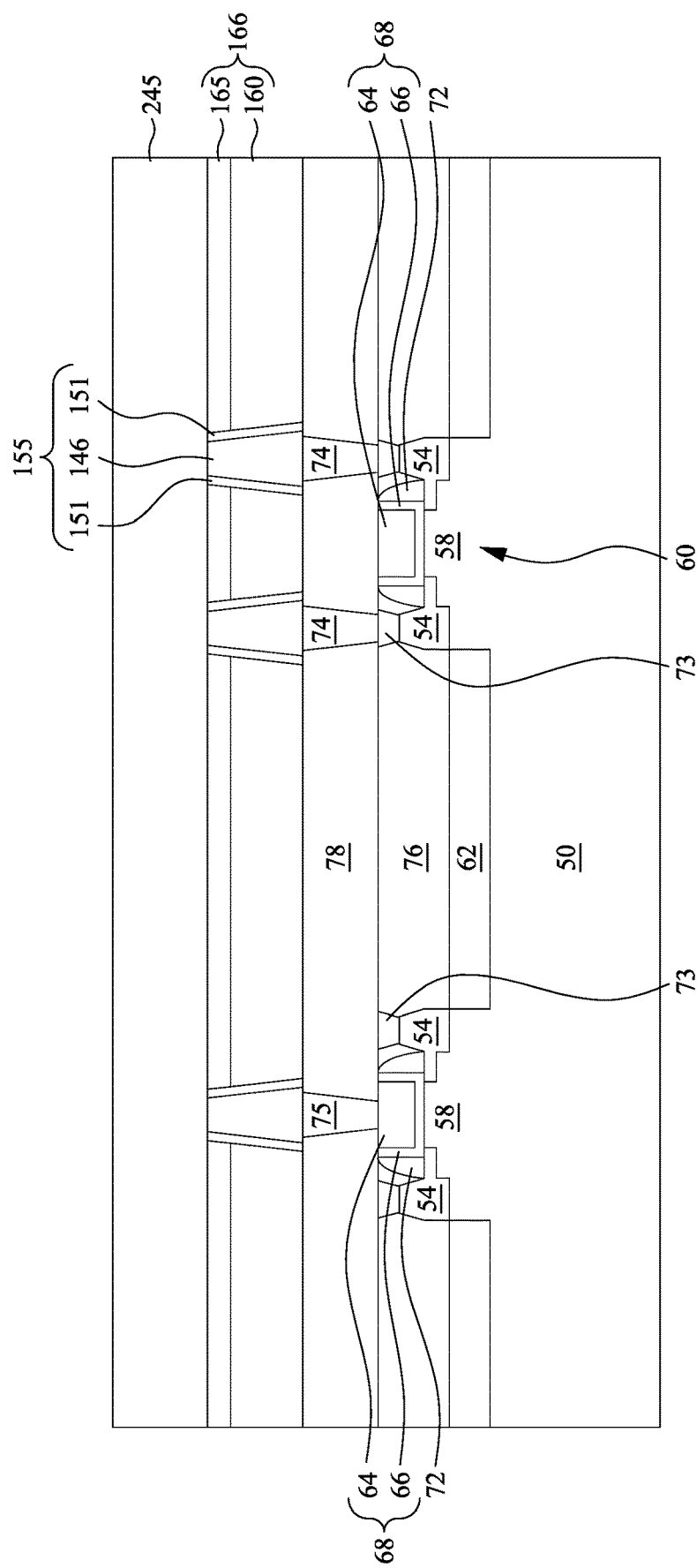

Reference is made to FIG. 11. A metal layer 245 is formed over the dielectric layer 165. The metal layer 245 is in contact with the metal vias 155. In some embodiments, material of the metal layer 245 can include copper or copper alloys, or other suitable conductive materials, such as silver, gold, tungsten, aluminum, or other suitable materials. In some embodiments, the metal layer 245 may be formed by, for example, CVD, ALD, PVD, or the like.

Figure 12:
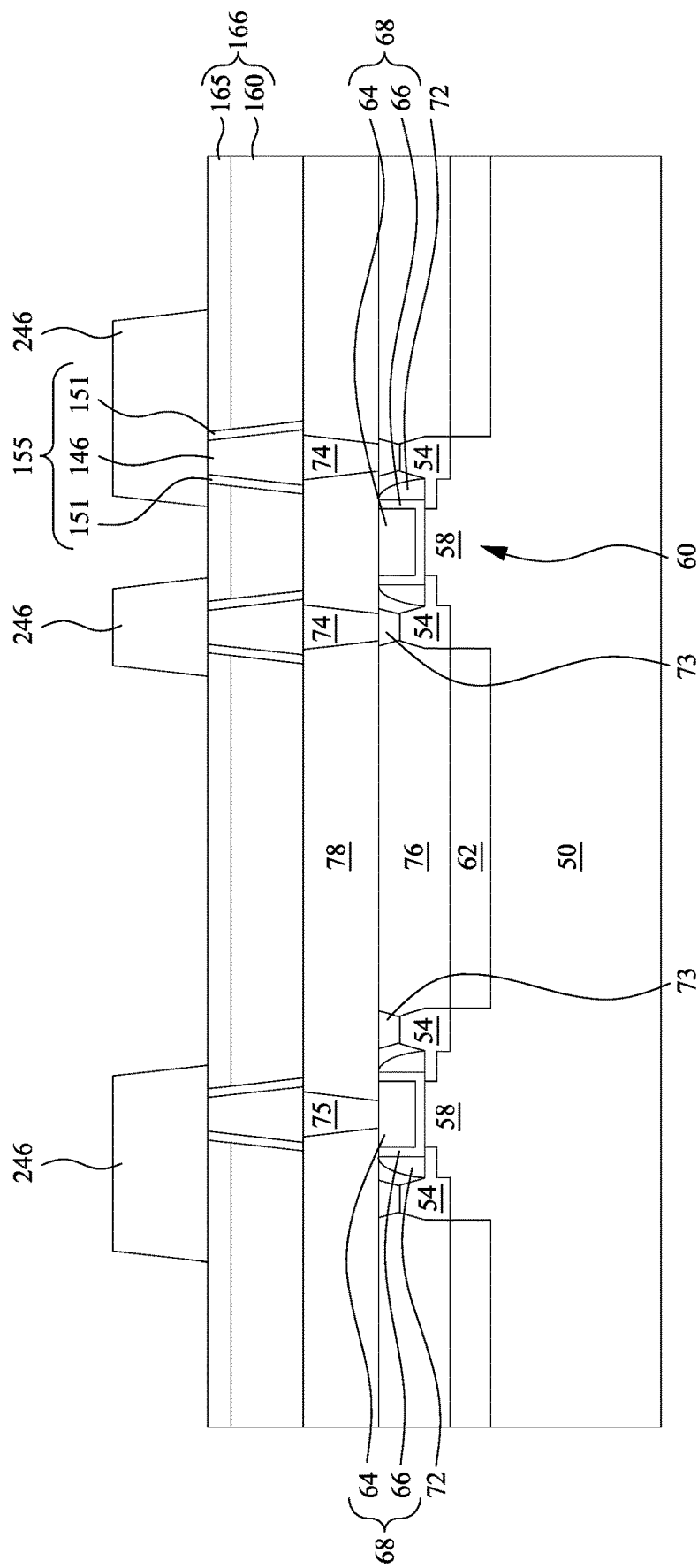

Reference is made to FIG. 12. The metal layer 245 is patterned to form a plurality of metal lines 246. The metal vias 155 have longest dimensions extending vertically, and the metal lines 246 have longest dimensions extending laterally, and thus the metal vias 155 conduct current vertically and are used to electrically connect two conductive features located at vertically adjacent levels, whereas the metal lines 246 conduct current laterally and are used to distribute electrical signals and power within one level. In some embodiments, the metal layer 245 may be patterned by, for example, forming a mask layer (e.g., a photoresist) over the metal layer 245, patterning the mask layer to expose portions of the metal layer 245, and etching the exposed portions of the metal layer 245. The remaining portions of the metal layer 245 are referred to as metal lines 246. In some embodiments, the metal lines 246 are in contact with respective metal vias 155.

In some embodiments, during etching the metal layer 245, the dielectric layer 165 can act as a protective layer to protect the dielectric layer 160, because the dielectric layer 165 made of $SiO_2$ is less prone to be damaged than the dielectric layer 160 made of SiCO:H. In some embodiments, the etchant of etching the metal layer 245 may be $NF_3$, $CH_4$, $C_2H_6$, $C_3F_8$, CxHyFz.

In some embodiments, each of metal lines 246 may include a trapezoid cross-sectional profile. That is, a width of the metal line 246 may decrease as a distance from the substrate 50 increases. Stated another way, a top surface of the metal line 246 is narrower than a bottom surface of the metal line 246. In some embodiments, metal lines 246 have bottom surfaces in contact with dielectric layer 165, the via plugs 146, and the diffusion barriers 151.

Figure 13:
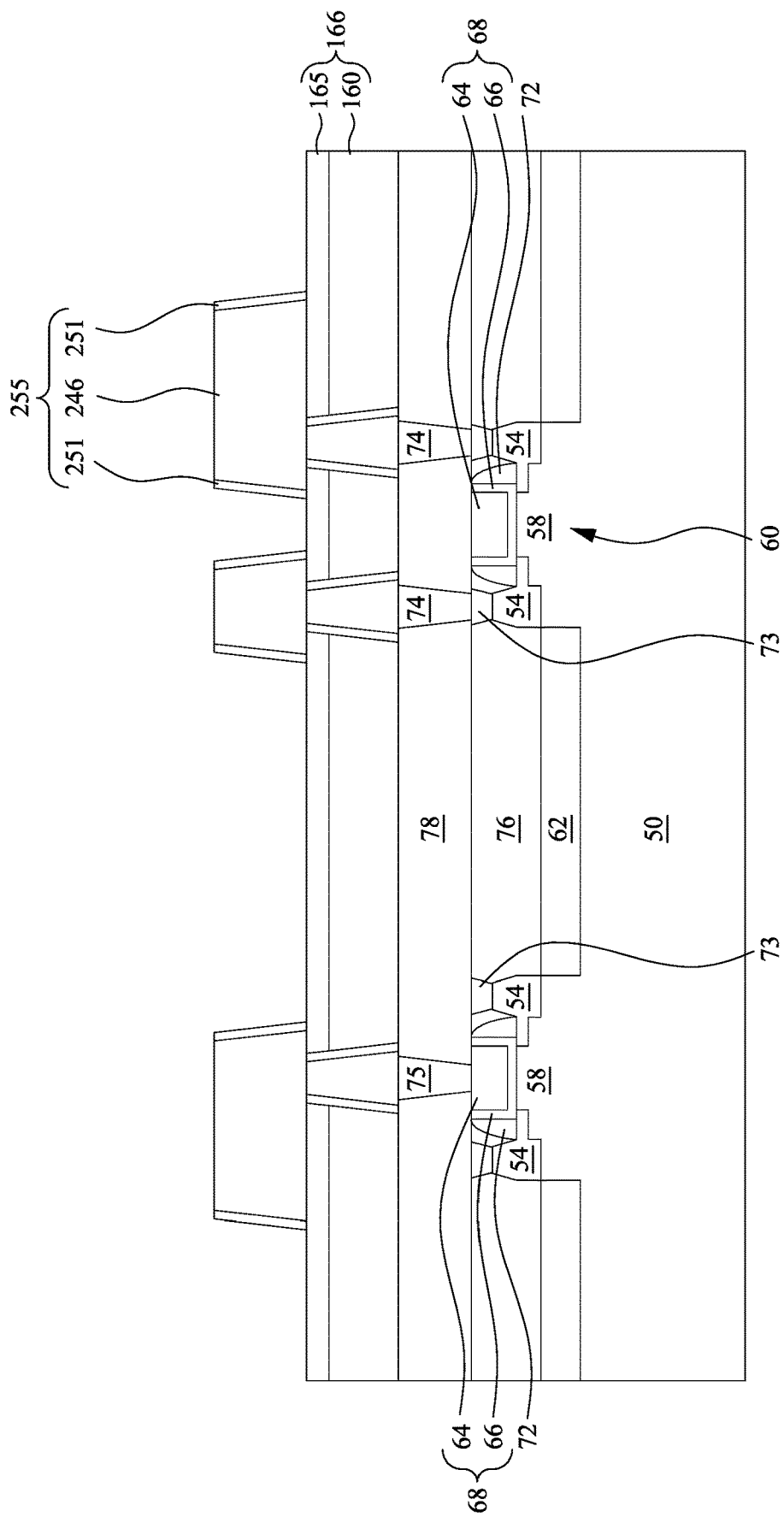

Reference is made to FIG. 13. Diffusion barriers 251 are on opposite sidewalls of each of the metal lines 246. In some embodiments, the diffusion barriers 251 may be formed by, for example, depositing a diffusion barrier layer over the metal lines 246 and the dielectric layer 165, performing an anisotropic etching process remove horizontal portions of the diffusion barrier layer on the top surfaces of the dielectric layer 165 and on the top surfaces of the metal lines 246. After the etching process, the remaining portions of the diffusion barrier layer can be referred to as the diffusion barriers 251.

After the diffusion barriers 251 are formed, the diffusion barriers 251 and a corresponding metal line 246 may be collectively referred to as a metal line structure 255. In some embodiments, each of the metal line structure 255 includes the metal line 246 and the diffusion barriers 251 lining opposite sidewalls of the metal line 246. In some embodiments, the bottom surfaces of the diffusion barriers 251 are in contact with the dielectric layer 165, and are substantially level with the bottom surface of the metal line 246. In some embodiments, the diffusion barriers 251 are separated from the metal vias 155 by the metal line 246.

Figure 14:
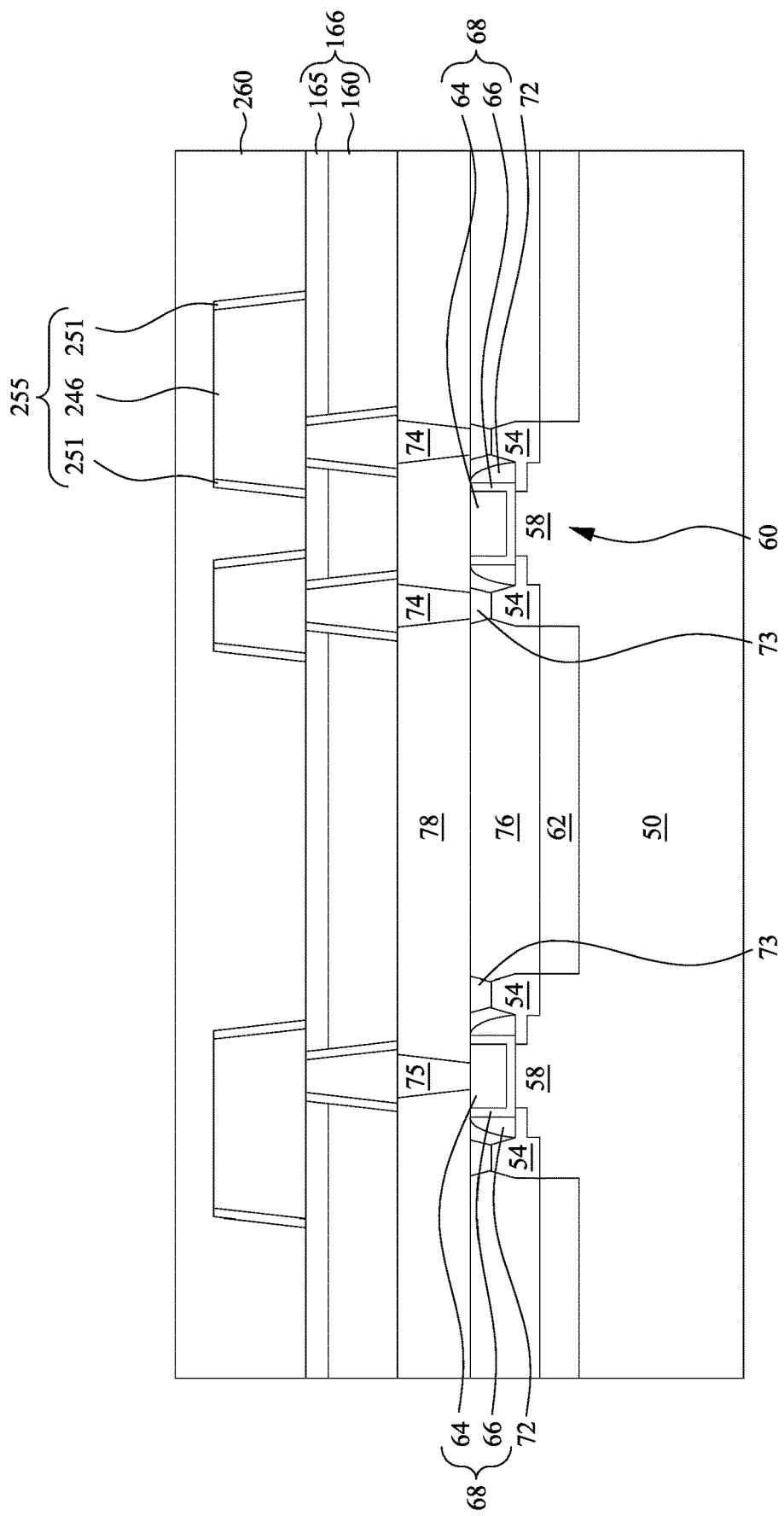

Reference is made to FIG. 14. A dielectric layer 260 is formed over the metal line structures 255 and filling the spaces between the metal line structures 255. In some embodiments, the dielectric layer 260 is in contact with the top surface of the dielectric layer 165, and is in contact with the sidewalls and the top surface of the metal line structures 255. In greater details, the dielectric layer 260 is in contact with outer sidewalls and top surfaces of the diffusion barriers 251, and is in contact with the top surfaces of the metal lines 246.

In some embodiments, the dielectric layer 260 may be formed of a low-k dielectric material, such as hydrogen doped silicon oxycarbide (SiOC:H). Accordingly, the dielectric layer 260 can also be referred to as a low-k dielectric layer. In some embodiments, the dielectric constant of the dielectric layer 260 is in a range from about 2.6 to about 3.5. In some embodiments where the dielectric layer 260 is made of hydrogen doped silicon oxycarbide (SiOC:H), the dielectric constant of the dielectric layer 260 is about 3.9. The dielectric layer 260 can be deposited with a high-density plasma CVD (HDPCVD) or a PECVD process or flowable CVD process. In some embodiments, the dielectric layer 260 may include a lower dielectric constant than the dielectric layer 165.

Figure 15:
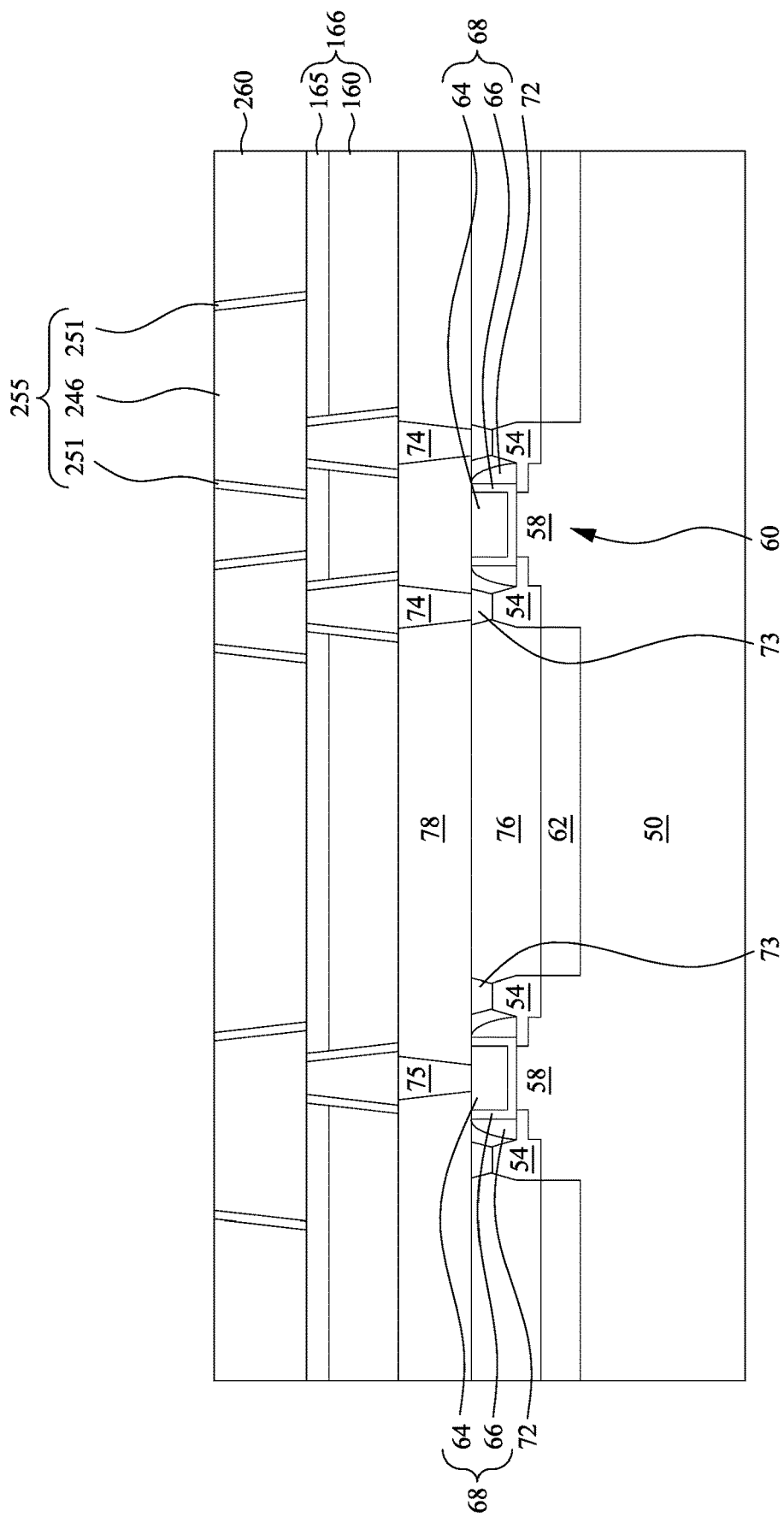

Reference is made to FIG. 15. A CMP process is performed to remove excess material of the dielectric layer 260 until the metal line structures 255 are exposed. In some embodiments, after the CMP process, the top surface of the dielectric layer 260 is substantially level with the top surfaces of the metal line structures 255. In greater details, the CMP process is performed to lower the top surface of the dielectric layer 260 from a position higher than the top surfaces of the metal line structures 255 to a position that is level with the top surfaces of the metal line structures 255. In some other embodiments, the CMP process may be omitted.

Figure 16:
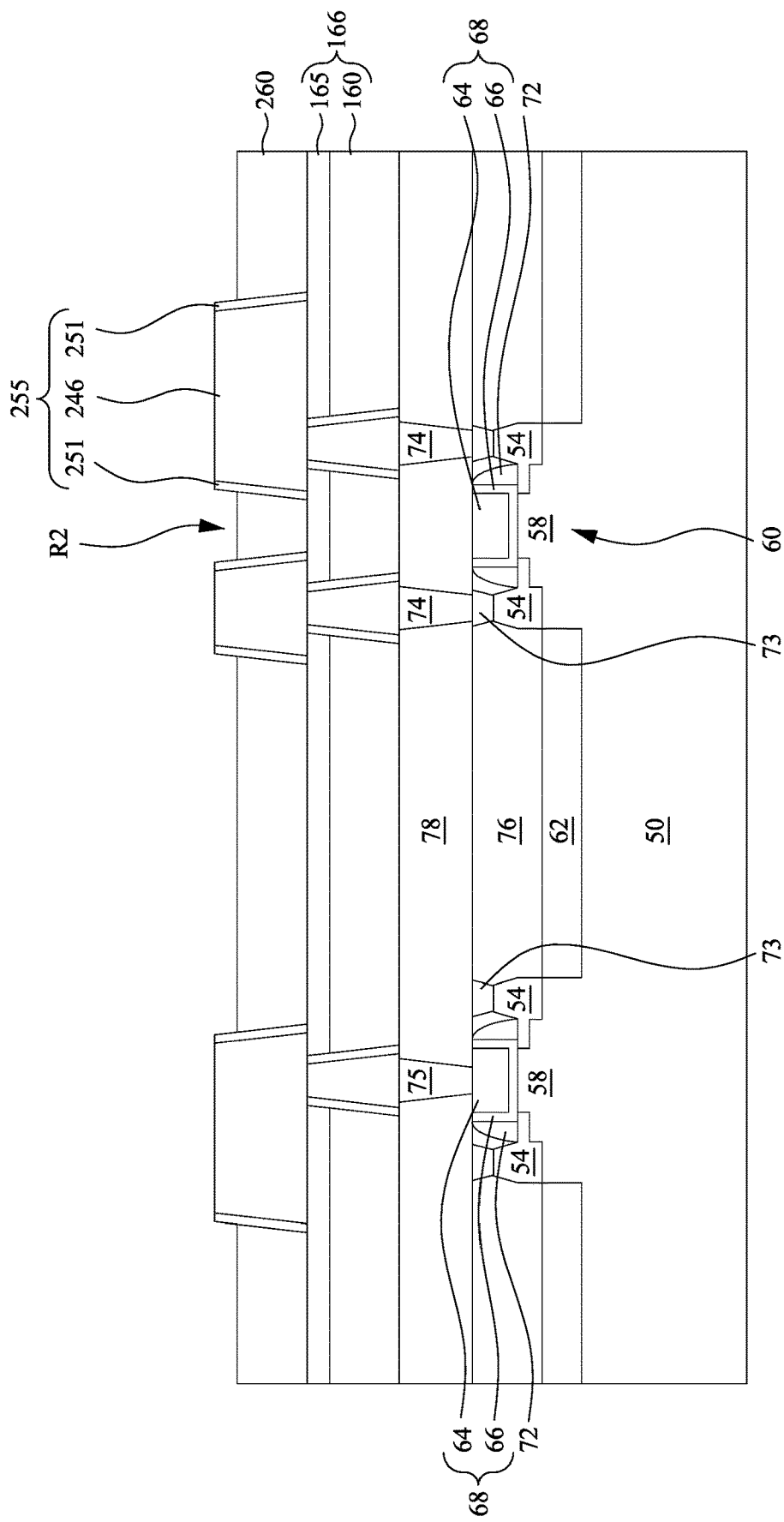

Reference is made to FIG. 16. The dielectric layer 260 is etched back to form recesses R2 between the metal line structures 255. Accordingly, sidewalls of the upper portions of the metal line structures 255 are exposed. In greater details, the sidewalls of the upper portions of the diffusion barriers 251 of the metal line structures 255 are exposed.

In some embodiments, the top surface of the dielectric layer 260 is lowered from a position that is level with the top surfaces of the metal line structures 255 to a position lower than the top surfaces of the metal line structures 255. In some embodiments where the CMP process of FIG. 18 is omitted, the etching back process may be performed to the structure shown in FIG. 17. In that case, the etching back process pulls back the top surface of the dielectric layer 260 from a position higher than the top surfaces of the metal line structures 255 to a position lower than the top surfaces of the metal line structures 255.

Figure 17:
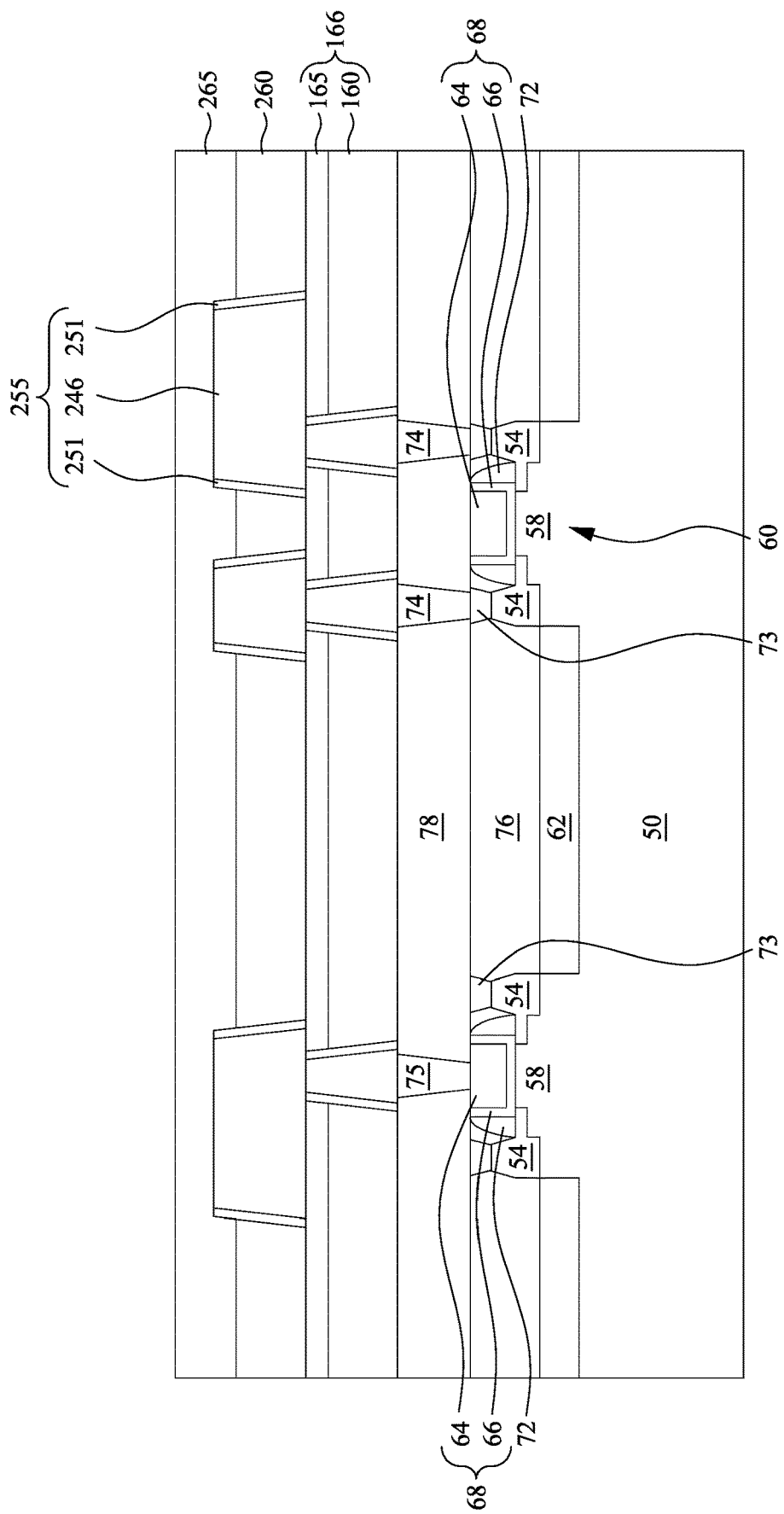
Figure 18:
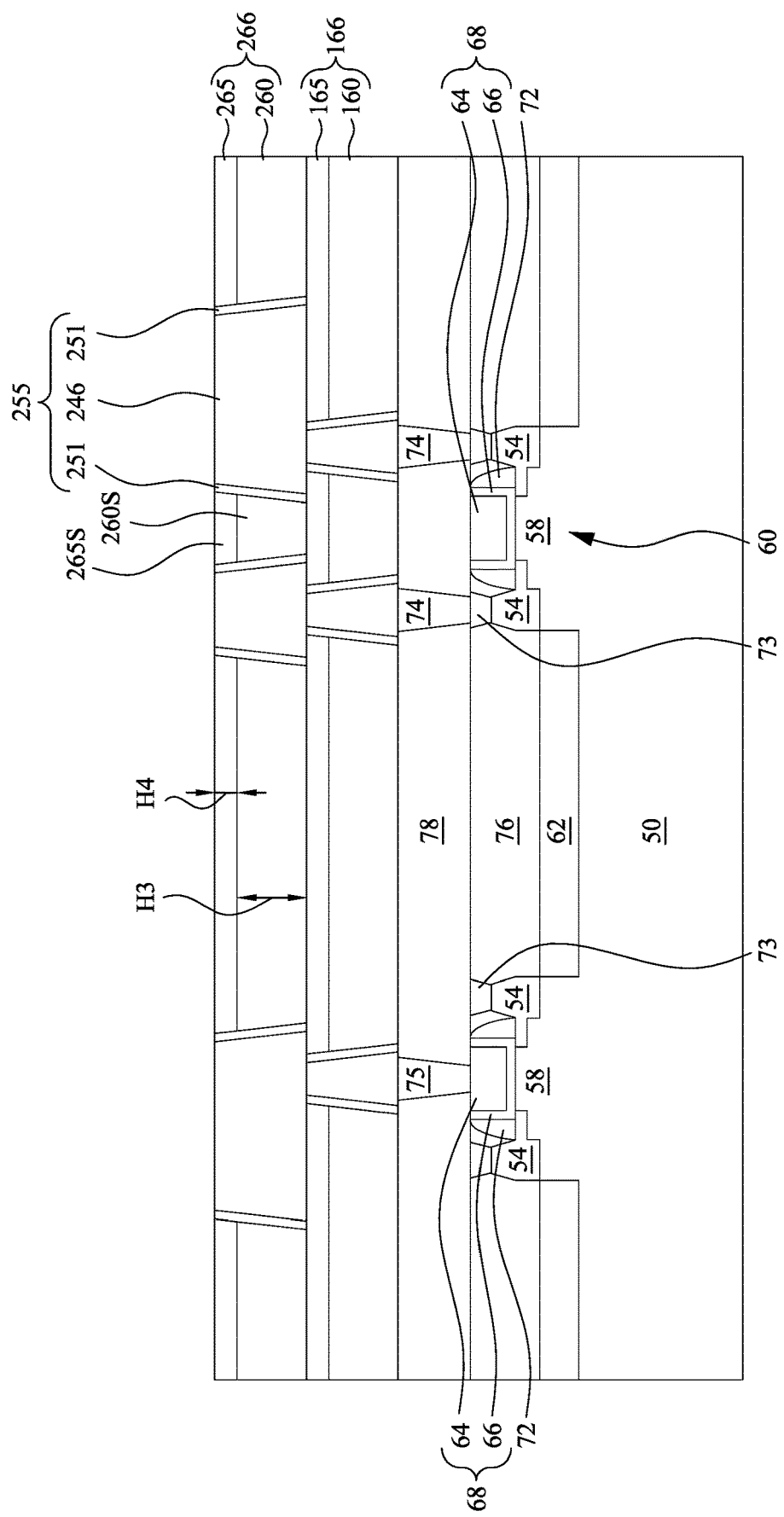

Reference is made to FIG. 17. A dielectric layer 265 is formed over the metal line structures 255 and filling the recesses R2 between the metal line structures 255. In some embodiments, the dielectric layer 265 is in contact with the top surface of the dielectric layer 260, and is in contact with the sidewalls and the top surface of the metal line structures 255. In greater details, the dielectric layer 260 is in contact with upper portions of the sidewalls of the metal line structures 255 and top surfaces of the metal line structures 255.

In some embodiments, the dielectric layer 265 may include a dielectric material that has a higher dielectric constant than the dielectric layer 260. In some embodiments where the dielectric layer 265 is made of silicon oxide, the dielectric constant of the dielectric layer 265 is about 3.9. In some embodiments, the atomic percentage of carbon of the dielectric layer 260 may be higher than that of the dielectric layer 265. On the other hand, the atomic percentage of oxygen of the dielectric layer 260 may be lower than that of the dielectric layer 265. In some embodiments, the dielectric layer 265 may include silicon oxide. The dielectric layer 165 can be deposited with a high-density plasma CVD (HDPCVD), PECVD, ALD, PEALD, or other suitable processes.

Reference is made to FIG. 18. A CMP process is performed to remove excess material of the dielectric layer 265 until the metal line structures 255 are exposed. In some embodiments, after the CMP process, the top surface of the dielectric layer 265 is substantially level with the top surfaces of the metal line structures 255. In greater details, the CMP process is performed to lower the top surface of the dielectric layer 265 from a position higher than the top surfaces of the metal line structures 255 to a position that is level with the top surfaces of the metal line structures 255. In some embodiments, the dielectric layers 260 and 265 may be collectively referred to as an inter-metal dielectric (IMD) layer 266.

After the CMP process is complete, the dielectric layer 260 has a height H3 and the dielectric layer 265 has a height H4. In some embodiments, the height H3 of the dielectric layer 260 is greater than the height H4 of dielectric layer 265. Stated another way, the dielectric layer 260 is thicker than the dielectric layer 265 along the vertical direction.

In some embodiments, the height H4 of dielectric layer 265 is in a range from about 100 Å to about 300 Å. If the height H4 of dielectric layer 265 is too large (e.g., much greater than 300 Å), the height H3 of the dielectric layer 260 may be accordingly reduced, and the overall dielectric constant may be too high. If the height H4 of dielectric layer 265 is too small (e.g., much lower than 100 Å), the dielectric layer 265 may not be sufficient to protect the underlying dielectric layer 260.

In some embodiments, after the CMP process is complete, the dielectric layer 260 may include inter-line dielectric portions 260S each between two adjacent metal line structures 255, and the dielectric layer 265 may include inter-line dielectric portions 265S each between two adjacent metal line structures 255, in which the inter-line dielectric portion 265S of the dielectric layer 265 is over the inter-line dielectric portion 260S of the dielectric layer 260. In some embodiments, the inter-line dielectric portion 260S of the dielectric layer 260 and the inter-line dielectric portion 265S of the dielectric layer 265 may include an inverted trapezoid cross-sectional profile. That is, a width of the inter-line dielectric portion 260S of the dielectric layer 260 and a width of the inter-line dielectric portion 265S of the dielectric layer 265 may increase as distance from the substrate 50 increase. Stated another way, the top surface of the inter-line dielectric portion 260S of the dielectric layer 260 is wider than the bottom surface of the inter-line dielectric portion 260S of the dielectric layer 260, and the top surface of the inter-line dielectric portion 265S of the dielectric layer 265 is wider than the bottom surface of the inter-line dielectric portion 265S of the dielectric layer 265. In some embodiments, the top surface of the inter-line dielectric portion 265S of the dielectric layer 265 is wider than the top surface of the inter-line dielectric portion 260S of the dielectric layer 260, and the bottom surface of the inter-line dielectric portion 265S of the dielectric layer 265 is wider than the bottom surface of the inter-line dielectric portion 260S of the dielectric layer 260.

Figure 19:
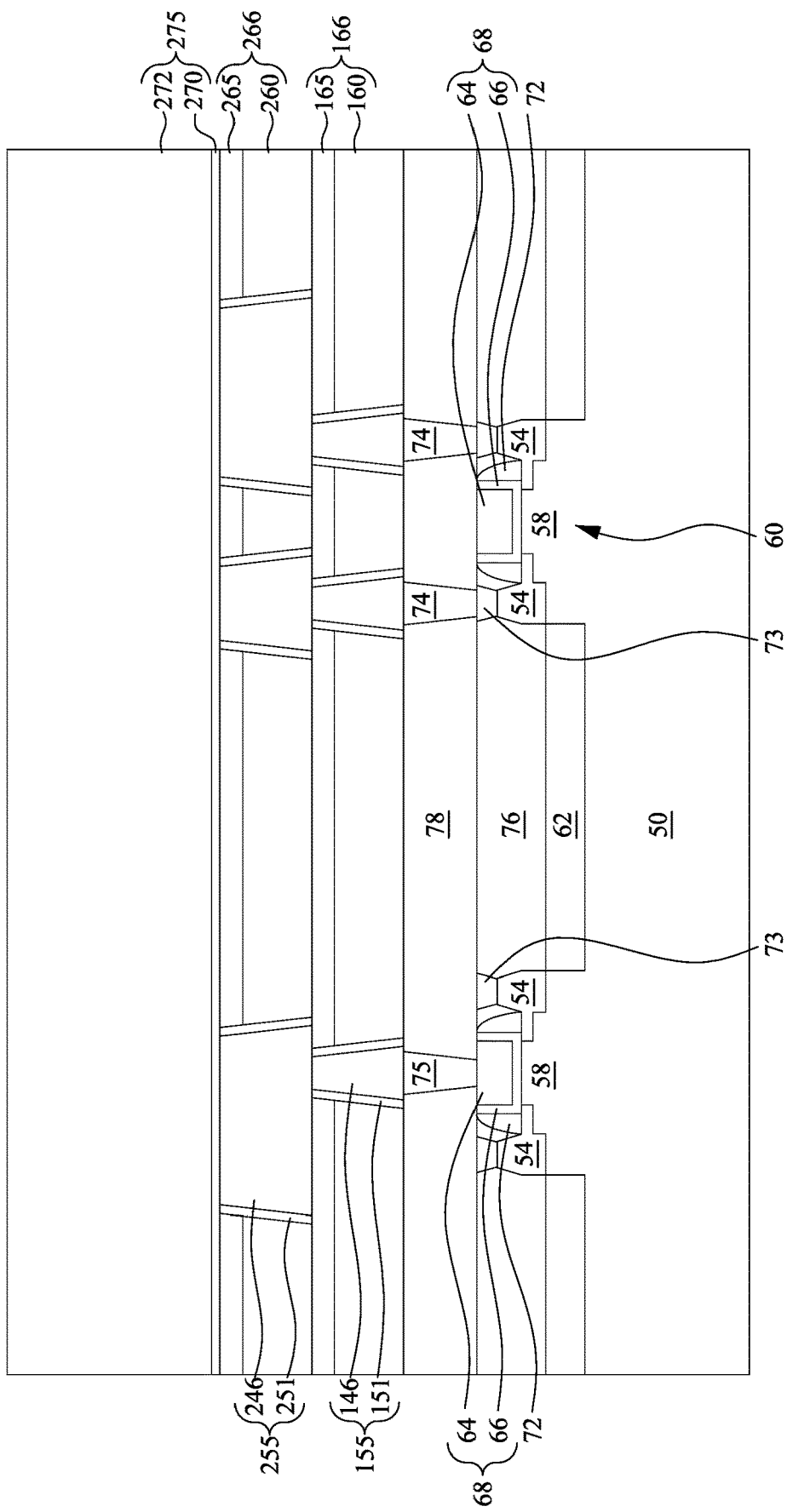

Reference is made to FIG. 19. An etch stop layer 270 and a dielectric layer 272 are formed over the IMD layer 266. In some embodiments, the etch stop layer 270 includes one or more insulator layers (e.g., SiN, SiC, SiCN, SiCO, CN, combinations thereof, or the like) having an etch rate different than an etch rate of an overlying dielectric layer 272. In some embodiments, the dielectric layer 272 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The etch stop layer 270 and the dielectric layer 272 may be deposited using suitable method, such as CVD, physical vapor deposition (PVD), ALD, PEALD, PECVD, SACVD, FCVD, spin-on, and/or the like, or a combination thereof. In some embodiments, the etch stop layer 270 and the dielectric layer 272 may be collectively referred to as inter-metal dielectric (IMD) layer 275. In some embodiments, the etch stop layer 270 is thinner than the dielectric layer 272 along the vertical direction. In some embodiments, the dielectric layer 272 may be made of the same material as the dielectric layers 160 and 260, and thus the dielectric layer 272 may include a dielectric material that has a lower dielectric constant than the dielectric layer 160.

Figure 20:
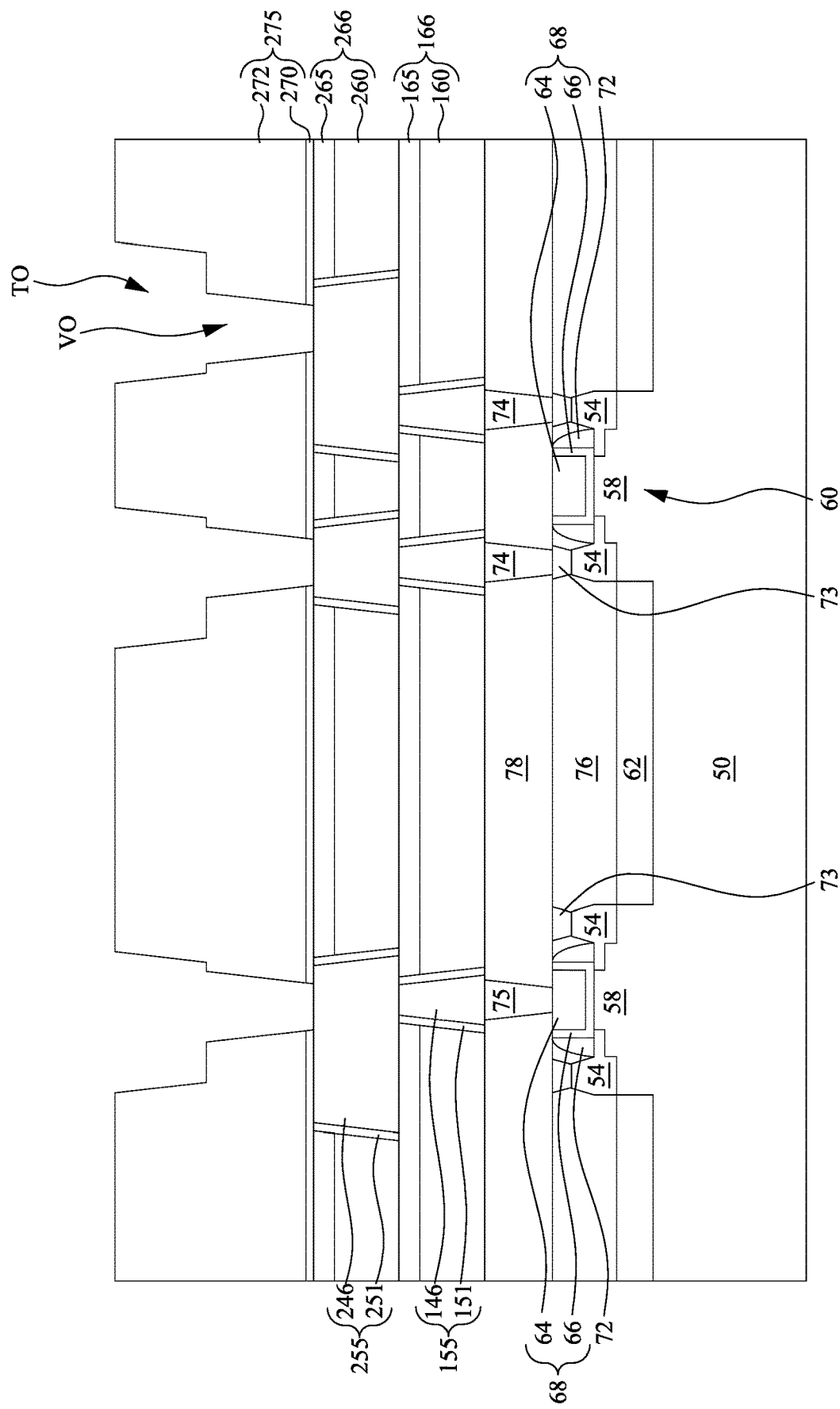

Reference is made to FIG. 20. The IMD layer 275 is formed with a dual damascene opening including trench openings TO and via openings VO, in which each trench opening TO is above and in spatial communication with one or more via openings VO. In some embodiment, a dual damascene techniques may include a "via-first" patterning method or a "trench-first" patterning method, and the trench openings TO and the via openings VO may be formed using a typical lithographic with masking technologies and anisotropic etch operation (e.g., plasma etching or reactive ion etching). Although the embodiments illustrate dual damascene openings in the IMD layer 275, single damascene processing may also be employed.

Figure 21:
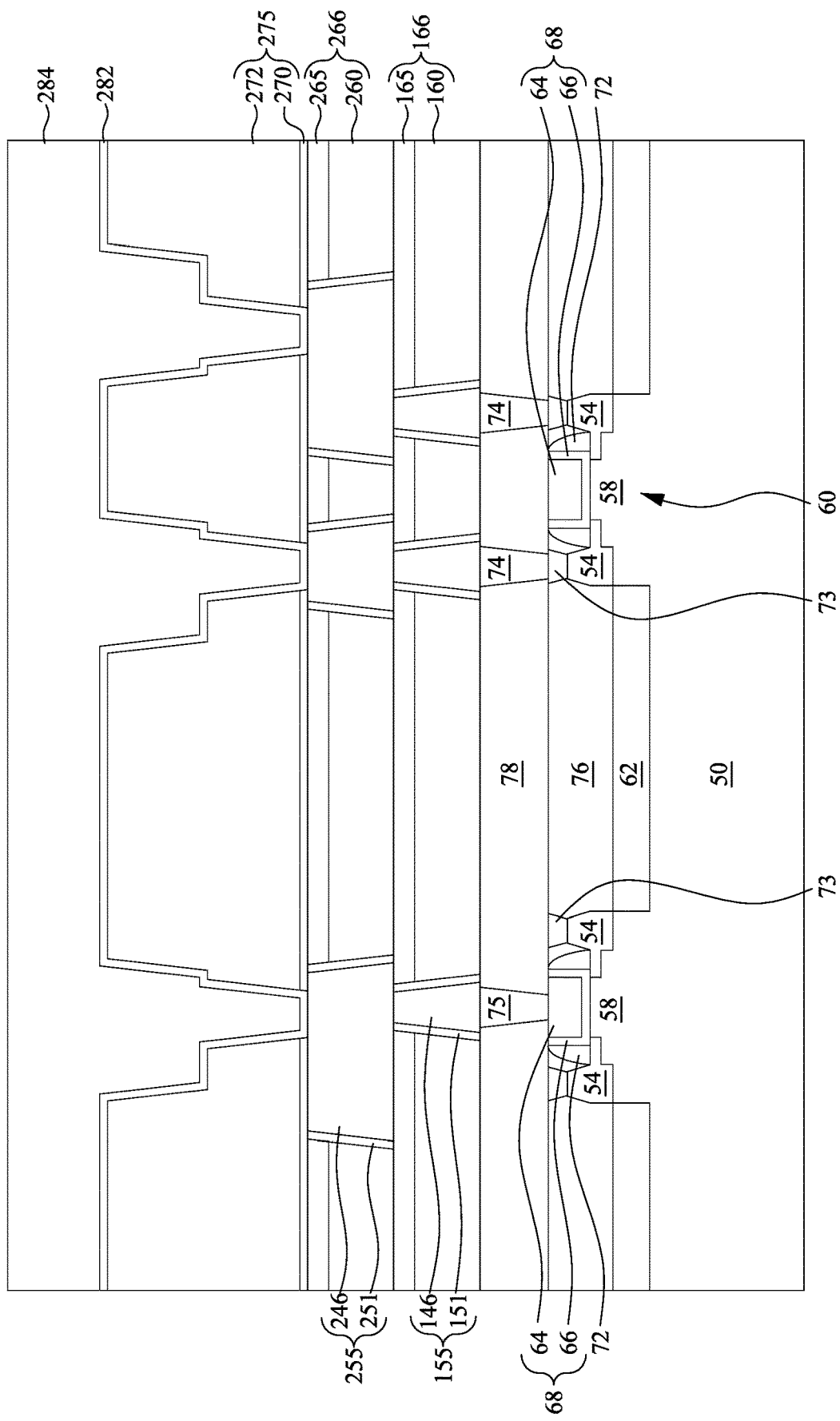

Reference is made to FIG. 21. A barrier layer 282 is deposited lining the trench openings TO and the via openings VO. A metal layer 284 is deposited in the trench openings TO and the via openings VO, over the barrier layer 282, and overfilling the trench openings TO. In some embodiments, the barrier 282 may include barrier materials such as titanium (Ti), titanium nitride (TiN), tantalum (Ta), tantalum nitride (TaN), and combinations thereof, and can be formed using CVD, ALD, PVD, or the like. In some embodiments, material of the metal layer 284 can include copper or copper alloys, or other suitable conductive materials, such as silver, gold, tungsten, aluminum, or other suitable materials, and can be formed using CVD, ALD, PVD, or the like. In some embodiments, the barrier layer 282 may be omitted.

Reference is made to FIG. 22. A CMP process is performed to remove excess materials of the barrier layer 282 and the metal layer 284. After the CMP process is complete, the remaining metal layer 284 has portions in the via openings VA and portions in the trench openings TO. In some embodiments, the portions of the metal layer 284 in the via openings VA can be referred to as via portions 284V that serve as metal vias to conduct current vertically between different interconnect levels, while the portions of the metal layer 284 in the via openings VA can be referred to as metal line portions 284M that serve as metal lines to conduct current laterally and distribute electrical signals and power within a same level.

In some embodiments, due to different formation processes, each of the via portions 284V of the metal layer 284 and each of the metal line portions 284M of the metal layer 284 may include different cross-sectional profile from each of the metal vias 155 and each of the metal line structures 255. For example, the via portions 284V of the metal layer 284 and the metal line portions 284M of the metal layer 284 may include an inverted trapezoid cross-sectional profile, while the metal vias 155 and the metal line structure 255 may include a trapezoid cross-sectional profile. That is, a width of the via portions 284V and/or metal line portions 284M may increase as a distance from the substrate 50 increases. Stated another way, a top surface of the via portions 284V (or a top surface of the metal line portions 284M) is wider than a bottom surface of the via portions 284V (or a bottom surface of the metal line portions 284M). Here, the term "via portion" may be the portion having longest dimensions extending vertically, and the term "metal line portion" may be the portion having longest dimensions extending laterally, and thus the via portions 284V conduct current vertically and are used to electrically connect two conductive features located at vertically adjacent levels, whereas the metal line portions 284M conduct current laterally and are used to distribute electrical signals and power within one level.

The IMD layer 166, the metal vias 155 in the IMD layer 166, the IMD layer 266, and the metal line structures 255 in the IMD layer 266 may be collectively referred to as a metallization layer $108_1$. Furthermore, the IMD layer 275, e and the metal layer 284 in the IMD layer 275 may be collectively referred to as another metallization layer $108_2$ over the metallization layer $108_1$. It is understood that, as described above, the metallization layer $108_1$ and the metallization layer $108_2$ are formed by different processes.

The metallization layers $108_1$ and $108_2$ are parts of an interconnect structure 106. In some embodiments, the interconnect structure 106 may include more metallization layers disposed over the metallization layer $108_2$, while the additional metallization layers over the metallization layer $108_2$ may be formed by using similar method for forming the metallization layer $108_2$ as described with respect to FIGS. 19-22, which is different from the method for forming the metallization layer $108_1$ as described with respect to FIGS. 2-18. Formation of the interconnect structure 106 can be referred to as a back-end-of-line (BEOL) process.

Figure 23:
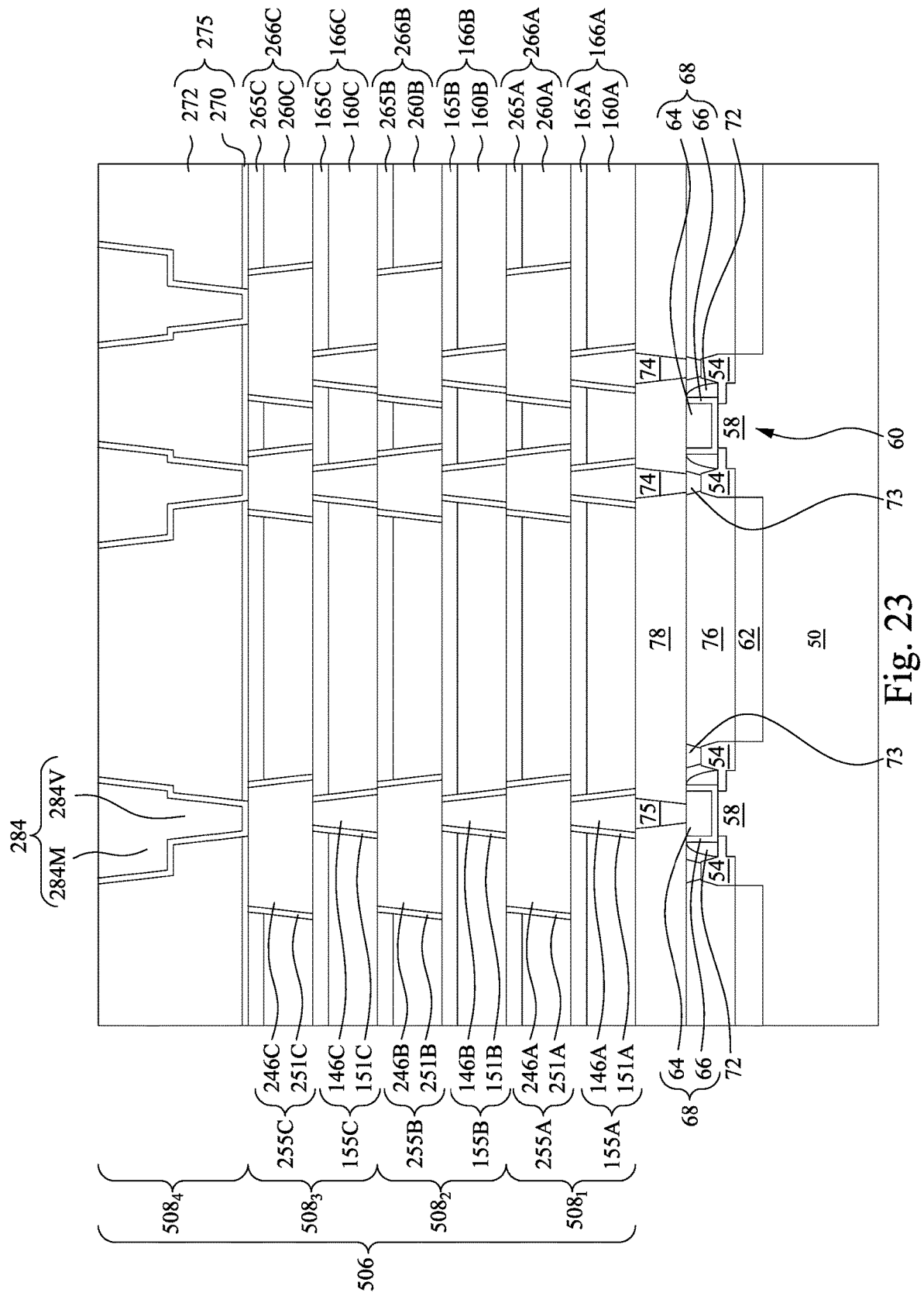
FIG. 23 is an integrated circuit structure according to an embodiment of the present disclosure.

FIG. 23 is an integrated circuit according to an embodiment of the present disclosure. Some elements discussed in FIG. 23 are the same as the elements discussed in FIGS. 1 to 22, such elements are labeled the same, and relevant details will not be repeated for simplicity. The difference between the structure of FIG. 23 and the structure of FIG. 22 is that the structure of FIG. 23 includes an interconnect structure 506, in which the interconnect structure 506 includes metallization layers $508_1$ to $508_4$. In some embodiments, each of the metallization layers $508_1$, $508_2$, and $508_3$ are similar to the metallization layer $108_1$ discussed in FIG. 22, and may be formed by similar method for forming the metallization layer $108_1$ discussed with respect to FIGS. 2 to 18. The metallization layers $508_4$ is similar to the metallization layer $108_2$ discussed in FIG. 22, and may be formed by similar method for forming the metallization layer $108_2$ discussed with respect to FIGS. 19 to 22.

For example, the metallization layer $508_1$ includes an IMD layer 166A, which includes a dielectric layer 160A and a dielectric layer 165A over the dielectric layer 160A. Metal vias 155A are disposed in the IMD layer 166A, and each metal via 155A includes a via plug 146A and diffusion barriers 151A on opposite sidewalls of the via plug 146A. The metallization layer $508_1$ further includes an IMD layer 266A over the IMD layer 166A, which includes a dielectric layer 260A and a dielectric layer 265A over the dielectric layer 260A. Metal line structures 255A are disposed in the IMD layer 266A, and each metal line structure 255A includes a metal line 246A and diffusion barriers 251A on opposite sidewalls of the metal line 246A.

The metallization layer $508_2$ includes an IMD layer 166B, which includes a dielectric layer 160B and a dielectric layer 165B over the dielectric layer 160B. Metal vias 155B are disposed in the IMD layer 166B, and each metal via 155B includes a via plug 146B and diffusion barriers 151B on opposite sidewalls of the via plug 146B. The metallization layer $508_1$ further includes an IMD layer 266B over the IMD layer 166B, which includes a dielectric layer 260B and a dielectric layer 265B over the dielectric layer 260B. Metal line structures 255B are disposed in the IMD layer 266B, and each metal line structure 255B includes a metal line 246B and diffusion barriers 251B on opposite sidewalls of the metal line 246B.

The metallization layer $508_3$ includes an IMD layer 166C, which includes a dielectric layer 160C and a dielectric layer 165C over the dielectric layer 160C. Metal vias 155C are disposed in the IMD layer 166C, and each metal via 155C includes a via plug 146C and diffusion barriers 151C on opposite sidewalls of the via plug 146C. The metallization layer $508_1$ further includes an IMD layer 266C over the IMD layer 166C, which includes a dielectric layer 260C and a dielectric layer 265C over the dielectric layer 260C. Metal line structures 255C are disposed in the IMD layer 266C, and each metal line structure 255C includes a metal line 246C and diffusion barriers 251C on opposite sidewalls of the metal line 246C.

It is understood that, as described above, the metallization layers $508_1$, $508_2$, and $508_3$ are formed by similar processes (as discussed previously with respect to FIGS. 2-18), while the metallization layer $508_4$ is formed by a different process than forming the metallization layers $508_1$, $508_2$, and $508_3$.

In some embodiments, the interconnect structure 506 may include more metallization layers disposed over the metallization layer $508_4$, while the additional metallization layers over the metallization layer $508_4$ may be formed by using similar method for forming the metallization layer $508_4$, such as those described with respect to FIGS. 19-22, which is different from the method for forming the metallization layers $508_1$, $508_2$, and $508_3$, such as those described with respect to FIGS. 2-18. Formation of the interconnect structure 506 can be referred to as a back-end-of-line (BEOL) process.

FIGS. 24 to 30 show various stages of a sequential manufacturing operation of an integrated circuit according to an embodiment of the present disclosure. FIGS. 24 to 30 illustrate different embodiments from the embodiments discussed in FIGS. 1 to 22. It is noted that some elements discussed in FIGS. 24 to 30 are the same as the elements discussed in FIGS. 1 to 22, such elements are labeled the same, and relevant details will not be repeated for simplicity.

Figure 24:
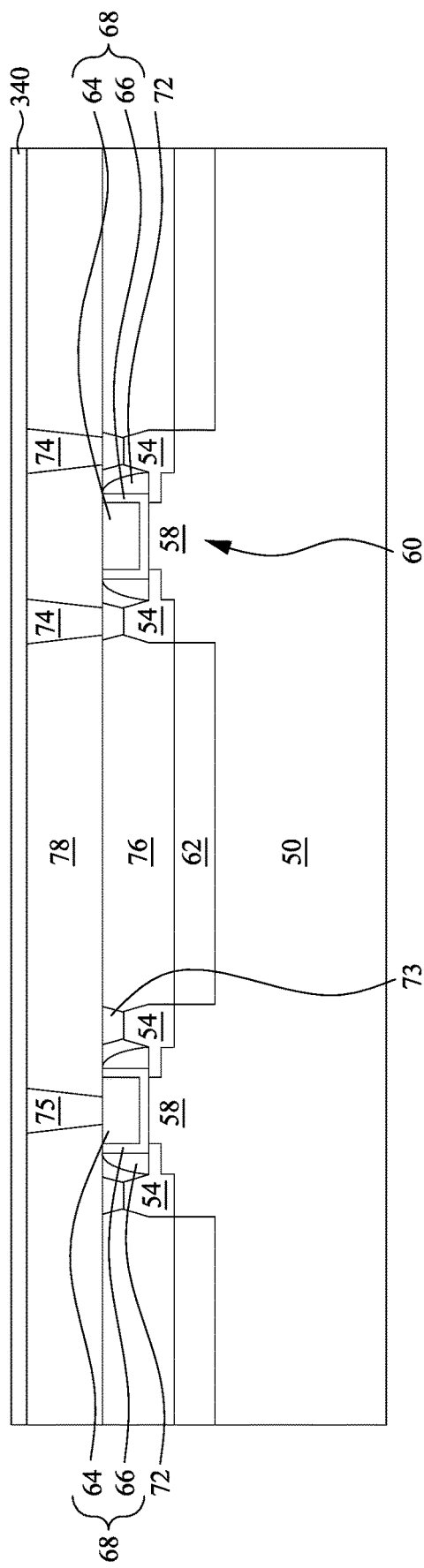
FIGS. 24 to 30 show various stages of a sequential manufacturing operation of an integrated circuit structure according to an embodiment of the present disclosure.

Reference is made to FIG. 24. An etch stop layer 340 is formed over the ILD layer 78. In some embodiments, the etch stop layer 340 is formed of SiN, SiCN, SiC, SiOCN, or the like. In some embodiments, the etch stop layer 340 may be formed by, for example, PECVD, ALD, CVD, or the like.

Figure 25:
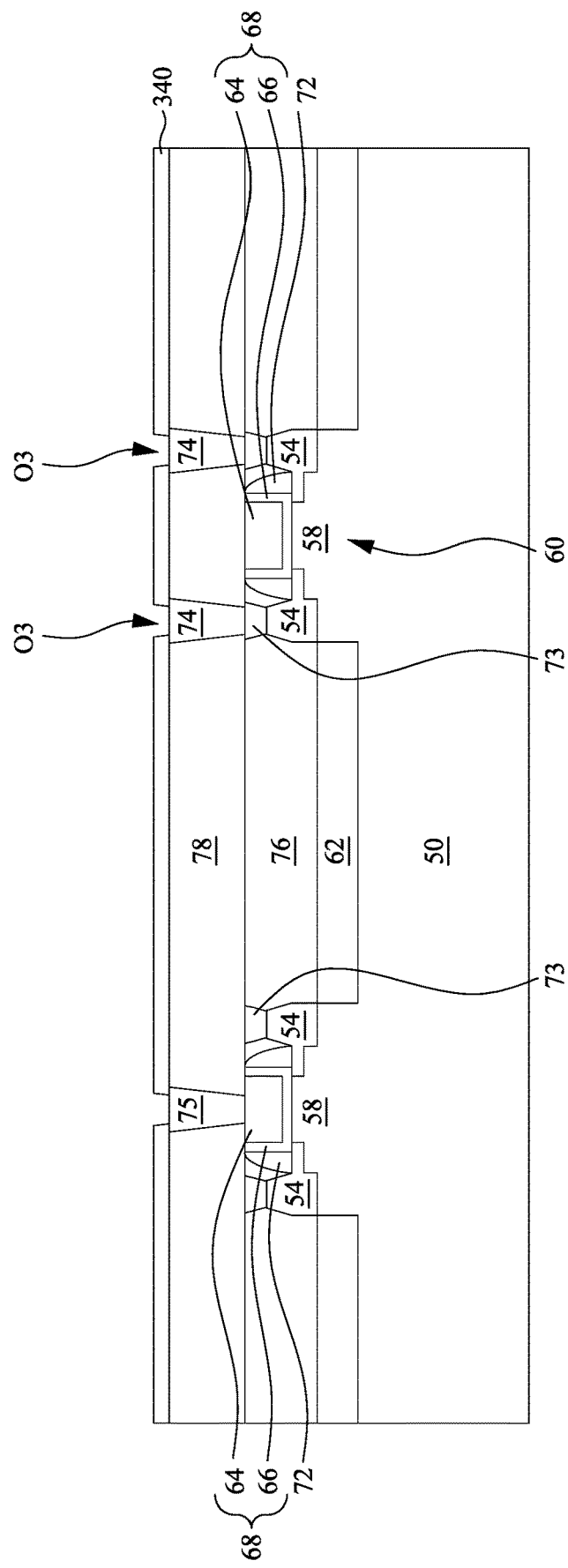

Reference is made to FIG. 25. The etch stop layer 340 is patterned to form openings O3 in the etch stop layer 340 that expose the contacts 74. In some embodiments, the openings O3 may be formed by, for example, forming a mask layer (e.g., a photoresist) over the etch stop layer 340, patterning the mask layer to expose portions of the etch stop layer 340, and etching the expose portions of the etch stop layer 340 to form the openings O3.

Figure 26:
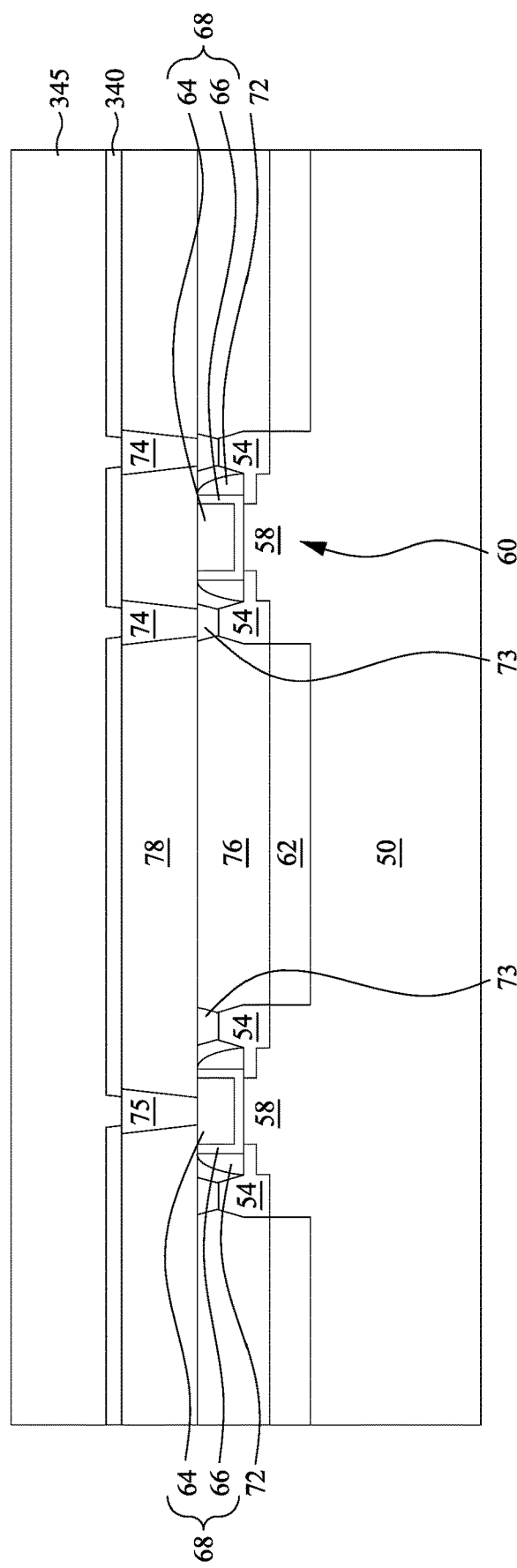

Reference is made to FIG. 26. A metal layer 345 is formed over the etch stop layer 340 and overfilling the openings O3 of the etch stop layer 340. In some embodiments, material of the metal layer 345 can include copper or copper alloys, or other suitable conductive materials, such as silver, gold, tungsten, aluminum, or other suitable materials. In some embodiments, the metal layer 345 may be formed by, for example, CVD, ALD, PVD, or the like.

Figure 27:
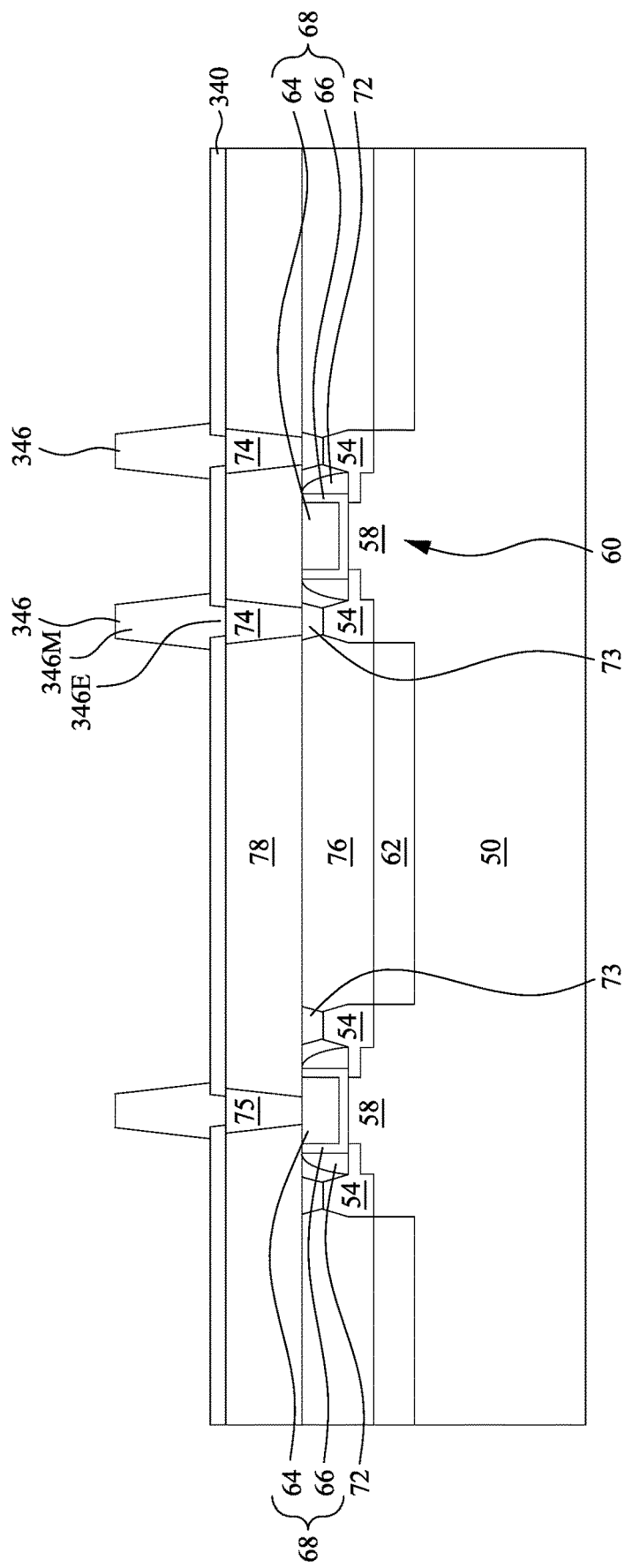

Reference is made to FIG. 27. The metal layer 345 is patterned to form a plurality via plugs 346. In some embodiments, the metal layer 345 may be patterned by, for example, forming a mask layer (e.g., a photoresist) over the metal layer 345, patterning the mask layer to expose portions of the metal layer 345, and etching the expose portions of the metal layer 345. The remaining portions of the metal layer 345 are referred to as via plugs 346.

In some embodiments, each of the via plugs 346 may include a main portion 346M and an extension portion 346E. In some embodiments, the main portion 346M is the portion of the via plug 346 that is above a top surface of the etch stop layer 340, and the extension portion 346E is the portion of the via plug 346 that extends through the etch stop layer 340. Stated another way, the extension portion 346E of the via plug 346 extends downwardly from a bottom of the main portion 346M of the via plug 346 into the etch stop layer 340 and further in contact with the contacts 74, respectively.

In some embodiments, the main portion 346M of the via plug 346 may include a trapezoid cross-sectional profile. That is, a width of the main portion 346M of the via plug 346 may decrease as a distance from the substrate 50 increases. Stated another way, a top surface of the main portion 346M of the via plug 346 is narrower than a bottom surface of the main portion 346M of the via plug 346. In some embodiments, the main portion 346M of the via plug 346 has a bottom surface in contact with a top surface of the etch stop layer 340.

Figure 28:
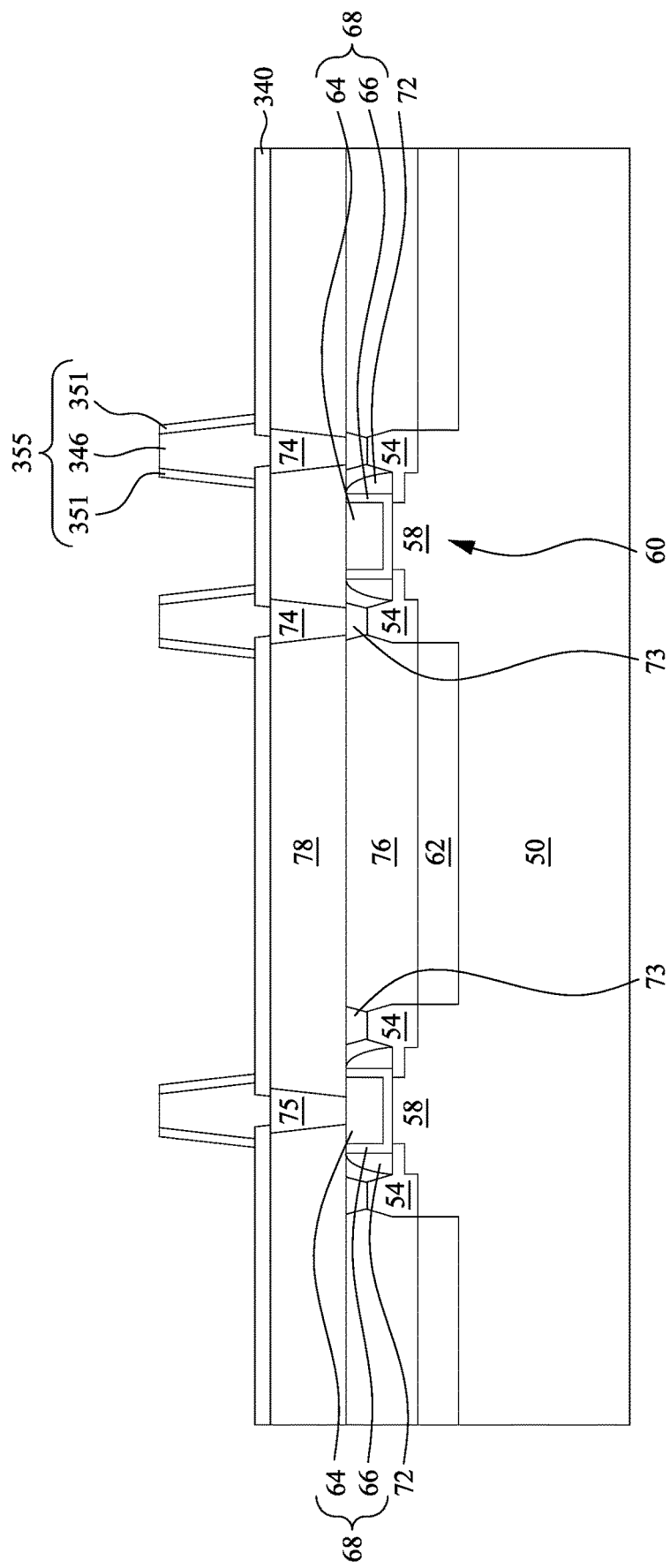

Reference is made to FIG. 28. Diffusion barriers 351 are formed on opposite sidewalls of each of the via plugs 346. The diffusion barriers 351 may be similar to the diffusion barriers 151 of FIGS. 1 to 22, and may be formed by similar method for forming the diffusion barriers 151 as described in FIGS. 4 and 5A.

After the diffusion barriers 351 are formed, the diffusion barriers 351 and a corresponding via plug 346 may be collectively referred to as a metal via 355. In some embodiments, each of the metal via 355 includes a via plug 346 and diffusion barriers 351 lining opposite sidewalls of the main portion 346M of the via plug 346. In some embodiments, the bottom surfaces of the diffusion barriers 351 are in contact with the etch stop layer 340, and are substantially level with the bottom surface of the portion 346M of the via plug 346. In some embodiments, the bottom surfaces of the diffusion barriers 351 are higher than the bottom surface of the extension portion 346E of the via plug 346.

In some embodiments, each metal via 355 has a main portion and an extension portion extending downwardly from the main portion. For example, the main portion 346M of the via plug 346 and the diffusion barriers 351 on opposite sides of the main portion 346M of the via plug 346 may collectively serve as the main portion of the metal via 355, and the extension portion 346E of the via plug 346 may serve as the extension portion of the metal via 355. In some embodiments, the extension portion of the metal via 355 is free from a material of the diffusion barriers 351.

In some embodiments, the main portion of the metal via 355 may include a trapezoid cross-sectional profile. That is, a width of the main portion 346M of the metal via 355 may decrease as a distance from the substrate 50 increases. Stated another way, a top surface of the main portion of the metal via 355 is narrower than a bottom surface of the main portion of the metal via 355.

Figure 29:
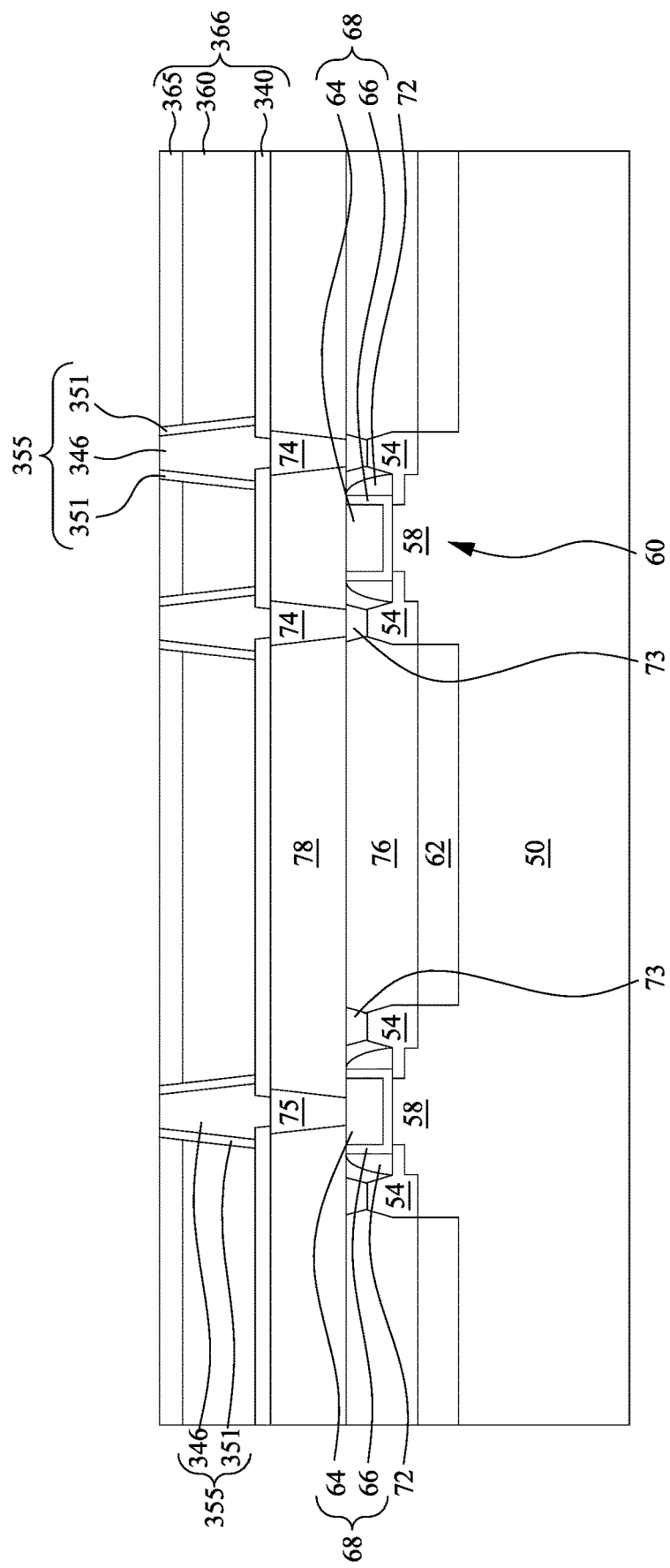

Reference is made to FIG. 29. A dielectric layer 360 and a dielectric layer 365 are formed over the etch stop layer 340, and laterally surrounding the metal vias 355. The dielectric layer 360 and the dielectric layer 365 are similar to the dielectric layer 160 and the dielectric layer 165 described in FIGS. 1 to 22, respectively, and may be formed by similar method for forming the dielectric layer 160 and the dielectric layer 165 as described in FIGS. 6 to 10. In some embodiments, the etch stop layer 340, the dielectric layer 360, and the dielectric layer 365 may be collectively referred to as an inter-metal dielectric (IMD) layer 366.

Figure 30:
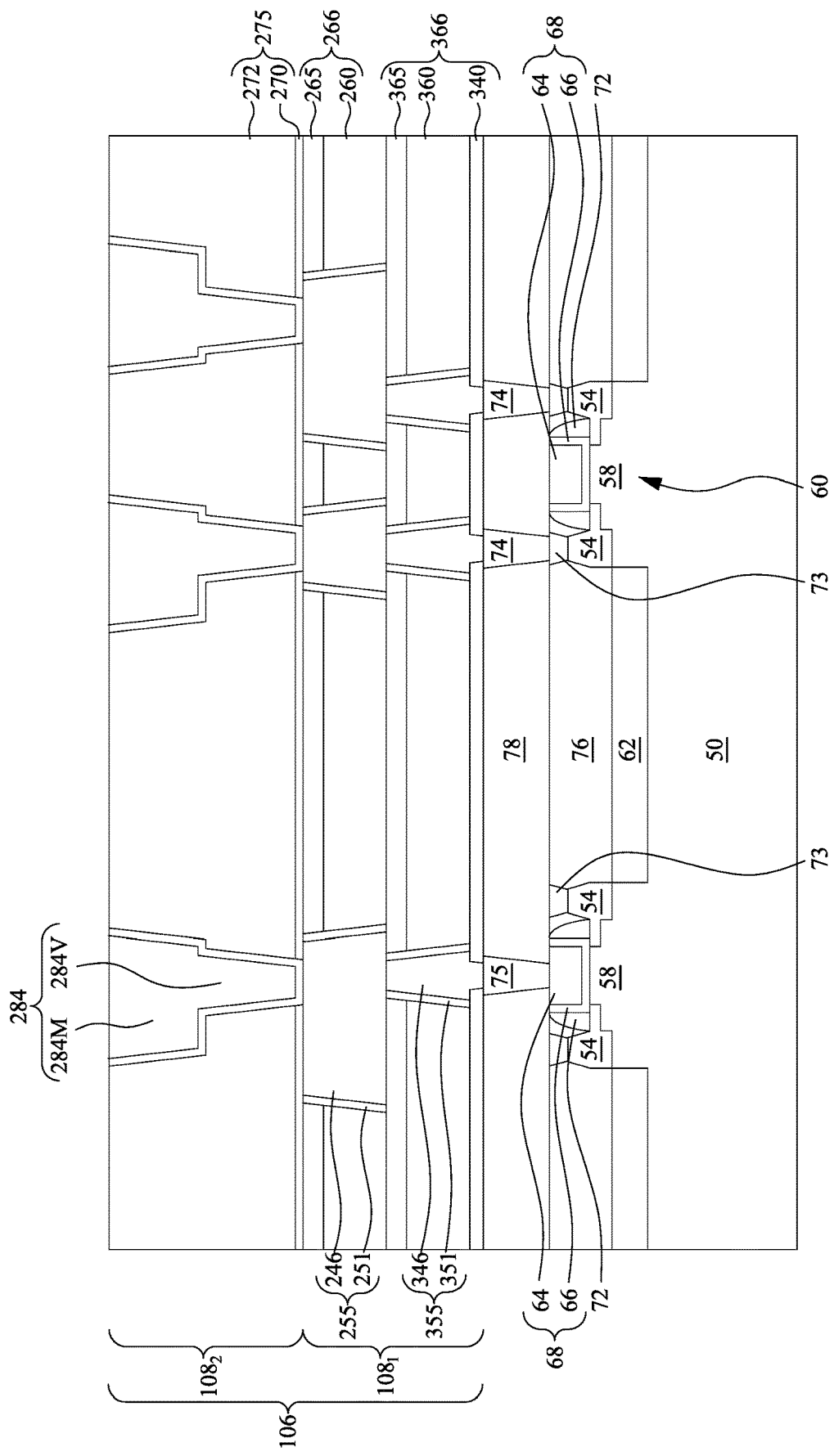

In some embodiments, the structure of FIG. 29 may undergo the processes described in FIGS. 11 to 22, and the resulting structure is shown in FIG. 30. The structure of FIG. 30 is similar to the structure of FIG. 22, while the difference between the structure of FIG. 30 and the structure of FIG. 22 is that the metallization layer $108_1$ of FIG. 30 includes the IMD layer 366 and the metal via 355.

In some embodiments, the interconnect structure 106 may include more metallization layers disposed over the metallization layer $108_2$, while the additional metallization layers over the metallization layer $108_2$ may be formed by using similar method for forming the metallization layer $108_2$ as described with respect to FIGS. 19-22, which is different from the method for forming the metallization layer $108_1$ as described with respect to FIGS. 2-18. Formation of the interconnect structure 106 can be referred to as a back-end-of-line (BEOL) process.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that by forming an IMD layer having a dielectric layer over a low-k dielectric layer, the low-k dielectric layer may be protected during some processes, such as etching process or pre-metal treatment, and thus the device reliability may be improved. For example, the TDDB and VBD performance of the device may be improved.

In some embodiments of the present disclosure, an integrated circuit structure includes a substrate, a transistor, a first dielectric layer, a metal contact, a first low-k dielectric layer, a second dielectric layer, and a first metal feature. The transistor is over the substrate. The first dielectric layer is over the transistor. The metal contact is in the first dielectric layer and electrically connected to the transistor. The first low-k dielectric layer is over the first dielectric layer. The second dielectric layer is over the first low-k dielectric layer and has a dielectric constant higher than a dielectric constant of the first low-k dielectric layer. The first metal feature extends through both second dielectric layer and the first low-k dielectric layer to the metal contact. In some embodiments, wherein a width of the first metal feature decreases as a distance from the substrate increases, while a width of the metal contact increases as a distance from the substrate increases. In some embodiments, the IC structure further includes a second low-k dielectric layer over the second dielectric layer; and a third dielectric layer over the second low-k dielectric layer and having a dielectric constant higher than a dielectric constant of the second low-k dielectric layer; and a second metal feature in the second low-k dielectric layer and the third dielectric layer and electrically connected to the first metal feature. In some embodiments, wherein the second low-k dielectric layer is in contact with the second dielectric layer. In some embodiments, the IC structure further includes a fourth dielectric layer over the third dielectric layer; and a dual damascene structure in the fourth dielectric layer. In some embodiments, wherein the dual damascene structure has a width decreasing in a first direction, and the first metal feature having a width decreasing in a second direction opposite the first direction. In some embodiments, the IC structure further includes an etch stop layer between the fourth dielectric layer and the third dielectric layer. In some embodiments, wherein the first metal feature comprises a via plug and diffusion barriers on opposite sidewalls of the via plug, and the via plug is in contact with the metal contact. In some embodiments, the IC structure further includes an etch stop layer between the first low-k dielectric layer and the first dielectric layer. In some embodiments, wherein the first metal feature comprises a main portion and an extension portion below the main portion, the main portion is embedded in the first low-k dielectric layer, the extension portion is embedded in the etch stop layer, and the extension portion have sidewalls laterally set back from sidewalls of the main portion.

In some embodiments of the present disclosure, an integrated circuit structure includes a substrate, a gate structure, source/drain regions, a source/drain contact, a gate contact, a source/drain via, a first metal feature, a second metal feature, a first low-k dielectric layer, a first dielectric layer. The gate structure is over the substrate. The source/drain regions are over the substrate and on opposite sides of the gate structure. The source/drain contact is over one of the source/drain regions. The source/drain via is over the source/drain contact. The gate contact is over the gate structure. The first metal feature is over the gate contact. The second metal feature is over the source/drain via. The first low-k dielectric layer laterally surrounds the first and second metal features. The first dielectric layer laterally surrounds the first and second metal features and is over the first low-k dielectric layer, in which the first dielectric layer has a higher dielectric constant and a smaller thickness than the first low-k dielectric layer. In some embodiments, the first metal feature comprises a via plug and diffusion barriers on opposite sidewalls of the via plug, and bottom surfaces of the diffusion barriers are substantially level with a bottom surface of the first low-k dielectric layer. In some embodiments, a bottom surface of the via plug is free from the diffusion barriers. In some embodiments, a top surface of the first dielectric layer is substantially level with top surfaces of the first and second metal features. In some embodiments, the first dielectric layer is silicon oxide.

In some embodiments of the present disclosure, a method includes forming a transistor over a substrate; forming an interlayer dielectric (ILD) layer over the transistor; depositing a metal layer over the ILD layer; patterning the metal layer to form a metal feature; depositing a low-k dielectric layer over the ILD layer and the metal feature; etching back the low-k dielectric layer to lower a top surface of the low-k dielectric layer to a position lower than a top surface of the metal feature; depositing a dielectric layer over the low-k dielectric layer and the metal feature; and performing a first CMP process to the dielectric layer until the metal feature is exposed. In some embodiments, the method further includes depositing a diffusion barrier over the ILD layer and the metal feature; and removing horizontal portions of the diffusion barrier to expose a top surface of the ILD layer and the top surface of the metal feature. In some embodiments, the method further includes performing a second CMP process to the low-k dielectric layer prior to etching back the low-k dielectric layer. In some embodiments, the dielectric layer is thinner than the low-k dielectric layer after performing the first CMP process. In some embodiments, the method further includes forming an etch stop layer over the ILD layer prior to forming the metal layer; and patterning the etch stop layer to form an opening in the etch stop layer prior to depositing the metal layer, wherein the metal layer is deposited in the opening of the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a transistor over a substrate;
forming an interlayer dielectric (ILD) layer over the transistor;
depositing a metal layer over the ILD layer;
patterning the metal layer to form a metal feature;
depositing a low-k dielectric layer over the ILD layer and the metal feature;
etching back the low-k dielectric layer to lower a top surface of the low-k dielectric layer to a position lower than a top surface of the metal feature;
depositing a dielectric layer over the low-k dielectric layer and the metal feature; and
performing a first CMP process to the dielectric layer until the metal feature is exposed.

2. The method of claim 1, further comprising:
depositing a diffusion barrier over the ILD layer and the metal feature; and
removing horizontal portions of the diffusion barrier to expose a top surface of the ILD layer and the top surface of the metal feature.

3. The method of claim 1, further comprising performing a second CMP process to the low-k dielectric layer prior to etching back the low-k dielectric layer.

4. The method of claim 1, wherein the dielectric layer is thinner than the low-k dielectric layer after performing the first CMP process.

5. The method of claim 1, further comprising:
forming an etch stop layer over the ILD layer prior to forming the metal layer; and
patterning the etch stop layer to form an opening in the etch stop layer prior to depositing the metal layer, wherein the metal layer is deposited in the opening of the etch stop layer.

6. A method, comprising:
forming a transistor over a substrate;
forming a first dielectric layer over the transistor;
forming a first etch stop layer over the first dielectric layer;
forming a first metal feature over the first etch stop layer and electrically connected to the transistor;
forming a first low-k dielectric layer over the first dielectric layer and surrounding a lower portion of the first metal feature, wherein the first metal feature comprises a main portion and an extension portion below the main portion, the main portion is embedded in the first low-k dielectric layer, the extension portion is embedded in the first etch stop layer; and
forming a second dielectric layer over the first low-k dielectric layer and surrounding an upper portion of the first metal feature, wherein the second dielectric layer has a dielectric constant higher than a dielectric constant of the first low-k dielectric layer.

7. The method of claim 6, wherein a width of the first metal feature decreases as a distance from the substrate increases.

8. The method of claim 6, further comprising:
forming a second metal feature over the second dielectric layer;
forming a second low-k dielectric layer over the second dielectric layer and surrounding a lower portion of the second metal feature; and
forming a third dielectric layer over the second low-k dielectric layer surrounding an upper portion of the second metal feature, wherein the third dielectric layer has a dielectric constant higher than a dielectric constant of the second low-k dielectric layer.

9. The method of claim 8, wherein the second low-k dielectric layer is in contact with the second dielectric layer.

10. The method of claim 8, further comprising:
forming a fourth dielectric layer over the third dielectric layer; and
forming a dual damascene structure in the fourth dielectric layer.

11. The method of claim 10, wherein the dual damascene structure has a width decreasing in a first direction, and the first metal feature having a width decreasing in a second direction opposite the first direction.

12. The method of claim 10, further comprising:
forming a second etch stop layer over the third dielectric layer prior to forming the fourth dielectric layer.

13. The method of claim 6, wherein the first metal feature comprises a via plug and diffusion barriers on opposite sidewalls of the via plug.

14. The method of claim 6, further comprising:
etching back the first low-k dielectric layer prior to forming the second dielectric layer; and
performing a planarization process to the second dielectric layer until the first metal feature is exposed.

15. A method, comprising:
forming a gate structure over a substrate;
forming source/drain regions over the substrate and on opposite sides of the gate structure;
forming a source/drain contact over one of the source/drain regions;
forming a gate contact over the gate structure;
forming a source/drain via over the source/drain contact;
forming a first metal feature over the gate contact;
forming a second metal feature over the source/drain via;
forming a first low-k dielectric layer laterally surrounding the first and second metal features;
etching back the first low-k dielectric layer; and
depositing a first dielectric layer laterally surrounding the first and second metal features and over the first low-k dielectric layer, wherein the first dielectric layer has a higher dielectric constant and a smaller thickness than the first low-k dielectric layer.

16. The method of claim 15, wherein,
the first metal feature comprises a via plug and diffusion barriers on opposite sidewalls of the via plug, and
bottom surfaces of the diffusion barriers are substantially level with a bottom surface of the first low-k dielectric layer.

17. The method of claim 16, wherein a bottom surface of the via plug is free from coverage by the diffusion barriers.

18. The method of claim 15, wherein a top surface of the first dielectric layer is substantially level with top surfaces of the first and second metal features.

19. The method of claim 15, wherein the first dielectric layer is made of silicon oxide.

20. The method of claim 15, further comprising performing a planarization process to the first dielectric layer until the first and second metal features are exposed.

* * * * *